United States Patent
Wada

[11] Patent Number: 6,115,280
[45] Date of Patent: *Sep. 5, 2000

[54] SEMICONDUCTOR MEMORY CAPABLE OF BURST OPERATION

[75] Inventor: Tomohisa Wada, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/833,178

[22] Filed: Apr. 4, 1997

Related U.S. Application Data

[63] Continuation of application No. 08/547,341, Oct. 24, 1995, abandoned.

[30] Foreign Application Priority Data

Nov. 1, 1994 [JP] Japan .................................. 6-268925

[51] Int. Cl.[7] ...................................................... G11C 7/00
[52] U.S. Cl. ........................ 365/78; 365/236; 365/189.2; 365/230.03
[58] Field of Search .............................. 365/236, 230.03, 365/189.12, 240, 189.02, 230.02, 78, 233

[56] References Cited

U.S. PATENT DOCUMENTS

| | | | |
|---|---|---|---|
| 4,899,310 | 2/1990 | Baba et al. .............................. | 365/78 X |
| 5,200,925 | 4/1993 | Morooka .................................. | 365/219 |
| 5,220,529 | 6/1993 | Kohiyara et al. ...................... | 365/78 X |
| 5,463,591 | 10/1995 | Aimoto et al. .................. | 365/189.12 X |
| 5,535,172 | 7/1996 | Reddy et al. .................. | 365/189.12 X |
| 5,561,633 | 10/1996 | Yamano .......................... | 365/230.03 X |

FOREIGN PATENT DOCUMENTS

| | | |
|---|---|---|
| 3-58386 | 3/1991 | Japan . |
| 3-76094 | 4/1991 | Japan . |
| 4-184791 | 7/1992 | Japan . |
| 5-144269 | 6/1993 | Japan . |

OTHER PUBLICATIONS

"IBM Prepares Synch SRAM Entries," Electric News, Jun. 6, 1994, p. 70.

Child, "RISC and Pentium drive demand for SRAMs that are fastest of the fast," Computer Design, Mar. 28, 1994, pp. 47–48.

*Primary Examiner*—A. Zarabian
*Attorney, Agent, or Firm*—McDermott, Will & Emery

[57] ABSTRACT

A semiconductor memory for operating in burst mode. The memory has a memory cell array divided into a plurality of memory blocks, a plurality of (e.g., 2) output registers each including a plurality of output data retaining blocks corresponding to the multiple memory blocks, and a burst counter unit. The output registers alternately receive data transferred from the memory cell array. In accordance with the result of counting by the burst counter unit, the data retained in the output registers is output alternately in bursts, whereby the speed of data read operation in the memory is boosted regardless of the operating speed of the memory cell array therein.

12 Claims, 16 Drawing Sheets

SEMICONDUCTOR MEMORY CAPABLE OF BURST OPERATION

This application is a continuation of application Ser. No. 08/547,341 filed Oct. 24, 1995, now abandoned.

BACKGROUND OF THE INVENTION

1. Field of the Invention

The present invention relates to a semiconductor memory capable of operating in burst mode and, more particularly, to a high-speed semiconductor memory used illustratively as a cache memory.

2. Description of the Related Art

There exist semiconductor memories capable of the so-called burst output. Such semiconductor memories include an address counter and a memory cell array. The address counter operates in response to a clock signal input. When read from memory cells in the memory cell array, the data is output in accordance with the result of the counting by the address counter.

FIG. 12 is a block diagram of a typical conventional SRAM capable of operating in burst mode. Referring to FIG. 12, the SRAM comprises a memory cell array 1, a decoder 2, a bit line precharging circuit 3, a sense amplifier and write driver 4, registers 21 and 23, a read/write control circuit 22, and a burst counter unit 80.

The memory cell array 1 includes a plurality of memory cells MC, MC, etc., a plurality of word lines 11, 11, etc., and a plurality of bit line pairs 12, 12, etc. The memory cells MC, MC, etc. constitute a matrix made of rows and columns, each cell accommodating data.

Each memory cell MC comprises two access transistors 13 and 14, two driver transistors 15 and 16, and two load resistors 17 and 18. The access transistors 13 and 14 and the driver transistors 15 and 16 are an n-channel MOS transistor each. The load resistors 17 and 18 are each composed of a resistance element, a p-channel MOS transistor or a thin film transistor.

The load resistor 17 and the driver transistor 15 are connected in series between a power supply node N1 that receives a supply potential and a grounding node N2 that receives a grounding potential. The load resistor 18 and the driver transistor 16 are also connected serially between the two nodes N1 and N2. The driver transistors 15 and 16 have their gate and drain electrodes connected by intersection.

The access transistor 13 has its gate electrode connected to a word line 11. The access transistor 13 is connected interposingly between one of the two bit lines constituting a bit line pair 12, 12 on the one hand, and the connection node (storage node) between the load resistor 17 and the driver transistor 15 on the other hand.

The access transistor 14 has its gate electrode connected to the word line 11. The access transistor 14 is connected interposingly between the other of the two bit lines constituting the bit line pair 12, 12 on the one hand, and the connection node (storage node) between the load resistor 18 and the driver transistor 16 on the other hand.

The word lines 11, 11, etc. are each furnished to select the memory cells arranged thereon. The bit line pairs 12, 12, etc. are each provided to transfer write and read data to and from the memory cell MC selected by the applicable word line 11.

An input pin 91 admits a clock signal CLK from the outside. An input pin 93 receives an advance signal ADV that is externally furnished. An input pin 94 receives an externally provided address strobe signal ADS. An input pin 100 admits an external address signal EXT.ADD from the outside. An input pin 101 gets a read/write control signal /WE furnished externally. The slash symbol (/) indicates that the signal having the symbol is an inverted signal. This applies throughout the description hereunder.

The burst counter unit 80 includes AND gates 81 and 82, a register 83 and a burst counter 84. The AND gate 81 receives the advance signal ADV and clock signal CLK, and outputs a signal representing the result of the AND operation on the two signals. The AND gate 82 admits the address strobe signal ADS and clock signal CLK, and outputs a signal denoting the result of the AND operation on the two signals.

The register 83 receives both the output signal of the AND gate 82 and the external address signal EXT.ADD. In operation, the register 83 takes the external address signal EXT.ADD into the burst counter unit 80 in response to the output signal from the AND gate 82. The n-bit address admitted into the register 83 is separated into a k-bit address and an (n−k)-bit address.

The burst counter 84 is a binary counter that receives the output signals of the AND gates 81 and 82, and the k-bit address following the address separation. In operation, the burst counter 84 loads the k-bit address by responding to the output signal of the AND gate 82, and increments the value of the k-bit address in reply to the output signal of the AND gate 81.

The k-bit address representing the result of the counting by the burst counter 84 is then recombined with the separated (n−k)-bit address. The result is an n-bit internal address that is fed to the decoder 2. Given the n-bit internal address signal INT.ADD, the decoder 2 selects one word line 11.

The register 21 receives the clock signal CLK and the read/write control signal /WE. The read/write control signal /WE is admitted into the register 21 responding to a leading edge of the clock signal CLK. The read/write control signal /WE indicates a write state when brought Low, and denotes a read state when driven High. The read/write control circuit 22 outputs a control signal for controlling the bit line precharging circuit 3 and the sense amplifier and write driver 4 in reply to the read/write control signal /WE admitted through the register 21.

Given the control signal from the read/write control circuit 22, the bit line precharging circuit 3 precharges a bit line pair 12, 12 to a predetermined high level in preparation for a read operation. Upon receipt of the control signal from the read/write control circuit 22, the sense amplifier and write driver 4 operates as follows:

In the write operation, the sense amplifier and write driver 4 transfers to the bit line pair 12, 12 the input data DI admitted into the register 23 from the outside via a data input/output pin 9.

The conventional SRAM of the above constitution typically works as follows: when the advance signal ADV is brought High, the address on the burst counter 84 is incremented every time a leading edge of the clock signal CLK is encountered. As the internal address signal INT.ADD is incremented in this manner, the decoder 2 selects different word lines 11 successively.

Below is a description of how the SRAM of FIG. 12 works in a read operation. FIG. 13 is a timing chart showing typical waveforms of signals used by the SRAM of FIG. 12 in the read operation.

Referring to FIGS. 12 and 13, the read/write control signal /WE is fixed to the high level for the read operation.

When a leading edge of the clock signal CLK is encountered, the address strobe signal ADS is brought High. This allows the external address input signal EXT.ADD to be admitted into the register 83.

Thereafter, every time the clock signal CLK is at a leading edge and the advance signal ADV is High, the address indicated by the internal address signal INT.ADD based on the address An given by the external address signal EXT.ADD is incremented by the burst counter 84. The incremented address occurs as An, An+1, An+2, etc. This causes a different word line 11 to be selected in each cycle of the clock signal CLK. As a result, the output data DO varies in the sequence of Qn, Qn+1, Qn+2, etc. This in turn allows data to be output in burst mode from memory cells MC, MC, etc. in the memory cell array 1.

Below is a description of how the SRAM of FIG. 12 works in a write operation. FIG. 14 is a timing chart showing typical waveforms of signals used by the SRAM of FIG. 12 in the write operation.

Referring to FIGS. 12 and 14, the read/write control signal /WE for the write operation is given as a pulse signal as opposed to the high-level signal used in the read operation. The input data DI (Dn, Dn+1, Dn+2, etc.) is admitted in synchronism with the pulse-type read/write control signal /WE.

In the write operation, the internal address INT.ADD based on the address An designated by the external address signal EXT.ADD varies in the same manner as in the read operation. This allows the input data DI to be written to memory cells MC, MC, etc. of the memory cell array 1 in the sequence of Dn, Dn+1, Dn+2, etc.

What follows is a description of another conventional semiconductor memory capable of operating in burst mode. The description will center on the read circuit portion of the semiconductor memory.

FIG. 15 is a block diagram of one such conventional SRAM also capable of operating in burst mode. In FIG. 15, the common parts that also appear in FIG. 12 are designated by like reference numerals, and their descriptions are omitted hereunder where redundant.

The semiconductor memory of FIG. 15 differs from that of FIG. 12 in the following aspects: the burst counter unit 80 is not provided; an output register 5, a multiplexer 7, a burst counter unit 8 and an internal register 20 are furnished; and the memory cell array 1 is divided into a plurality of memory blocks M0 through M3.

The memory cell array 1 has a plurality of memory cells (like the memory cells MC, MC, etc. in FIG. 12) divided into a plurality of (e.g., four) memory blocks M0 through M3 in columns. In this case, the memory cell array 1 is divided into four memory blocks M0 through M3 illustratively of 72 bits each. In FIG. 15, a single unit of data is shown to be composed of 72 bits.

An input pin 90 receives a memory address input signal MADD for selecting one of the word lines 11 in the memory cell array 1. The internal register 20 admits the memory address signal MADD using an appropriate timing (e.g., in synchronism with the address strobe signal ADS) and sends the admitted address to the decoder 2 as an internal address signal INT.ADD.

In response to the internal address signal INT.ADD, the decoder 2 selects one of the word lines 11 in the memory cell array 1. A sense amplifier 41 in FIG. 15 is a latch type sense amplifier that constitutes part of the sense amplifier and write driver 4 in FIG. 12.

With the word line 11 selected, the sense amplifier 41 receives the data items read simultaneously from the memory blocks M0 through M3 over the bit lines (see FIG. 12). The sense amplifier 41 amplifies each of the data items thus received.

The output register 5 is composed of a plurality of D type flip-flop circuits each retaining the data item amplified by the sense amplifier 41. With this output register 5, the D type flip-flop circuits correspond to the memory blocks M0 through M3 in the memory cell array 1, serving as four data retaining blocks 50 through 53 respectively. Each of the data retaining blocks 50 through 53 in the output register 5 retains data in reply to a transfer signal TR.

An input pin 92 receives an external chunk address signal EXT.CHA for selecting one of the data retaining blocks 50 through 53 in the output register 5.

The burst counter unit 8 is identical in structure to the burst counter unit 80 in FIG. 12, except that the external address signal EXT.ADD of FIG. 12 is replaced by the external chunk address signal EXT.CHA. Thus the detailed structure of the burst counter unit 8 will not be discussed further.

Responding to the clock signal CLK, the burst counter unit 8 increments the value designated by the external chunk address signal EXT.CHA. The incremented result of the counting serves as an internal chunk address signal INT.CHA.

In reply to the internal chunk address signal INT.CHA, the multiplexer 7 selects and outputs one of the four 72-bit data items retained in the output register 5. That is, the multiplexer 7 selects one of the data retaining blocks 50 through 53 in the output register 5 by responding to the result of the counting by the burst counter unit 8.

Given the internal chunk address signal INT.CHA, the multiplexer 7 successively transfers to the data input/output pin 9 the four 72-bit data items retained in the data retaining blocks 50 through 53.

In the manner described, the SRAM of FIG. 15 performs the read operation in burst mode.

Below is a more detailed description of how the SRAM of FIG. 15 works in a read operation. FIG. 16 is a timing chart showing typical waveforms of signals used by the SRAM of FIG. 15 in the read operation. In FIG. 16, the cycles of the clock signal CLK are numbered 1, 2, 3, etc.

Referring to FIG. 16, the address An designated by the memory address signal MADD is admitted into the internal register 20 in response to the first leading edge in the second cycle of the clock signal CLK. With the address An thus admitted, the word line 11 (WL) becomes selectable between the second and the fourth cycle. In response to this, data is read from the memory cell array 1 and is amplified by the sense amplifier 41.

In the fourth cycle, the transfer signal TR is brought High for a predetermined period of time. In response, the sense amplifier 41 transfers the amplified data to each of the data retaining blocks 50 through 53 in the output register 5 while the fourth cycle is in effect.

In the fifth cycle, the burst counter unit 8 admits an address AC stemming from the external chunk address signal EXT.CHA. The counting by the burst counter unit 8 starts in the fifth cycle. Between the fifth and the eighth cycle, the internal chunk address signal INT.CHA varies in the sequence of Ac, Ac+1, Ac+2, etc.

Consequently, the data items held in the data retaining blocks 50 through 53 of the output register 5 are output successively from the multiplexer 7 to the outside via the data input/output pin 9.

As described, the output data DO is output in burst mode, i.e., in the sequence of D(An), D(An+1), etc., from the fifth through the eighth cycle.

Data is then read from an address Am that is input as the memory address signal MADD following the address An. In this case, the data corresponding to the address Am is read in the same manner as the data corresponding to the address An.

While the data related to the current address An is under way, it is necessary to retain, in the data retaining blocks 50 through 53 of the output register 5, the data associated with the address An. For this reason, the transfer signal TR for reading the data corresponding to the next address Am is driven High in the ninth cycle following the completion of the burst output of the data associated with the current address An.

Therefore, the burst output of the output data DO related to the next address Am is carried out one cycle after the end of the burst output concerning the current address An, as shown in the sequence of D(Am), D(Am+1), etc. In this manner, the SRAM of FIG. 15 also allows the data therein to be read out in burst mode.

The conventional SRAMs outlined above have some disadvantages that will now be described.

With the conventional SRAM of FIG. 12, a word line 11 is selected and the related parts of the memory cell array 1 are activated in each of the cycles of the furnished clock signal CLK. It follows that the clock cycle time defining a period in which to repeat data output (called the data transfer called hereunder) is determined by the delay times in operations of the word lines 11, 11, etc., of the bit line pairs 12, 12, etc., and of the memory cell arrays MC, MC, etc.

This means that, with the SRAM of FIG. 12, attempts to reduce the cycle time of the clock signal CLK for higher operating speeds fail to make the cycle time shorter than the sum of the operative delays resulting from the parts of the memory cell array 1. Such delays in the operations of various parts in the memory cell array 1 prevent the SRAM of FIG. 12 from operating more quickly than at present.

With the SRAM of FIG. 15, the timing for the burst output of data is irrelevant to the operative delays of the various parts in the memory cell array 1. Such delays do not hamper efforts to make the memory as a whole operate at higher speeds than before. However, as mentioned above, the burst output of the data read from the memory cell array 1 poses a different problem.

That is, a data-free period (an interruption in the flow of data output) is bound to occur between two burst outputs, one relating to the current memory address An, the other associated with the next memory address Am.

Suppose that a data output interruption of one cycle period occurs following each burst output lasting four cycles. In that case, if one burst output is taken as a single period, the data transfer period is prolonged by 20 percent. In other words, the data transfer rate declines by 20 percent.

Thus although the SRAM of FIG. 15 is exempt from the operative delays in the parts of the memory cell array 1, the memory fails to shorten sufficiently the data transfer period in enhancing its operation speed. As a result, the SRAM of FIG. 15 is incapable of operating at a sufficiently high speed.

SUMMARY OF THE INVENTION

It is therefore an object of the present invention to provide a semiconductor memory operating in burst mode at a sufficiently high speed irrespective of the operating speed of its memory cell array.

It is another object of the present invention to provide a semiconductor memory working in burst mode for a high-speed read operation irrespective of the operating speed of its memory cell array and without causing data output interruptions.

It is a further object of the invention to provide a semiconductor memory working in burst mode for a high-speed write operation irrespective of the operating speed of its memory cell array.

In carrying out the invention and according to one aspect thereof, there is provided a semiconductor memory comprising a memory cell array, a plurality of output registers, an output register selecting circuit, a counter circuit, a data output pin and an output data transfer circuit. Each of the output registers includes a plurality of output data retaining blocks made of a plurality of columns each.

The memory cell array has a plurality of memory cells arranged in a plurality of rows and a plurality of columns for storing data. The memory cells are divided into a plurality of blocks.

The output registers each retain data read from the blocks of the memory cell array. The output data retaining blocks in each of the output registers correspond to the blocks of the memory cell array. Each of the output data retaining blocks retains data read from the corresponding block of the memory cell array.

The output register selecting circuit selects one of the output registers. The counter circuit performs a count in synchronism with a clock signal externally supplied. The data output pin outputs data to the outside.

The output data transfer circuit successively selects, in accordance with the result of the counting by the counter circuit, the output data retaining blocks of the output register selected by the output register selecting circuit. The output data transfer circuit then transfers the data from the successively selected output data retaining blocks to the data output pin, thereby outputting the data over a plurality of cycles of the clock signal.

With this structure, the data read from the multiple blocks of the memory cell array is set to and retained in the respective data retaining blocks in each of the multiple output registers.

The output register selecting circuit selects one output register. The data held in the multiple data retaining blocks of the selected output register is transferred to the data output pin by the output data transfer circuit. Data transfer is effected by the output data transfer circuit successively selecting the data in the data retaining blocks in response to the count result from the counter circuit. This causes the data read from the multiple blocks of the memory cell array to be output in burst mode.

Operating in this manner, the inventive semiconductor memory outputs in burst mode the retained data from one output register while transferring the data read from memory cells of the memory cell array to another output register. This makes it possible to output a plurality of target data items in burst mode without interruption therebetween.

With this kind of burst output carried out, the speed of the data read operation from the memory cell array to the outside is increased regardless of the operating speed of the memory cell array.

In a preferred structure according to the invention, the output register selecting circuit may receive an externally furnished address input signal designating the output register to be selected, and select that output register in accordance with the address input signal.

With this preferred structure, the output register selecting circuit selects one output register in response to the address input signal from the outside. This feature allows the output register to be selected externally as desired.

According to another aspect of the invention, there is provided a semiconductor memory comprising a memory cell, a plurality of output registers, a write register selecting circuit, a read register selecting circuit, a counter circuit, a data output pin and an output data transfer circuit. Each of the output registers includes a plurality of output data retaining blocks.

The memory cell array has a plurality of memory cells arranged in a plurality of rows and a plurality of columns for storing data. The memory cells are divided into a plurality of blocks made of a plurality of columns each.

The output registers each retain data written thereto after being read from the blocks of the memory cell array. The output data retaining blocks in each of the output registers correspond to the blocks of the memory cell array. Each of the output data retaining blocks retains data read from the corresponding block of the memory cell array.

The write register selecting circuit selects one of the output registers to which to write data read from the memory cell array. The read register selecting circuit selects one of the output registers from which to read the retained data. The counter circuit performs a count in synchronism with a clock signal externally supplied. The data output pin outputs data to the outside.

The output data transfer circuit successively selects, in accordance with the result of the counting by the counter circuit, the output data retaining blocks of the output register selected by the read register selecting circuit. The output data transfer circuit then transfers the data from the successively selected output data retaining blocks to the data output pin, thereby outputting the data over a plurality of cycles of the clock signal.

With this structure, the data read from the multiple blocks of the memory cell array is retained in the respective data retaining blocks in each of the output registers.

One of the multiple output registers is selected by the write register selecting circuit. The output register thus selected has data written thereto after its retrieval from the blocks of the memory cell array. Another output register is selected by the read register selecting circuit. From the output register thus selected, the retained data is read out. In this manner, the output register to which to write data and the output register from which to read retained data are selected by different selecting circuits.

The data retained in the multiple data retaining blocks of the selected output register is transferred by the output data transfer circuit to the data output pin. Data transfer is effected by the output data transfer circuit successively selecting the data in the data retaining blocks in response to the count result from the counter circuit. This causes the data read from the blocks of the memory cell array to be output in burst mode.

Operating in this fashion, the semiconductor memory of the invention outputs in burst mode the retained data from one output register while transferring the data read from the memory cell array to another output register. This makes it possible to output a plurality of target data items in burst mode without interruption therebetween.

With this kind of burst output carried out, the speed of the data read operation from the memory cell array to the outside is also increased regardless of the operating speed of the memory cell array.

In a preferred structure of the semiconductor memory according to the above aspect of the invention, the write register selecting circuit may receive an externally supplied first address input signal designating the output register to be selected, and select that output register in accordance with the first address input signal. Furthermore, the read register selecting circuit may receive an externally furnished second address input signal designating the output register to be selected, and select that output register according to the second address input signal.

With this preferred structure, the output register to which to write data and the output register from which to read data are selected as desired by use of address input signals supplied from the outside. This feature allows the internal workings of the semiconductor memory to be controlled externally at will.

In another preferred structure of the semiconductor memory according to the above aspect of the invention, there may be provided at least three units of the output registers. One of the output registers may fixedly retain some memory cell data from the memory cell array.

With this preferred structure, one of a minimum of three output registers fixedly accommodates some memory cell data from the memory cell array. Where frequently retrieved data is held fixedly in one single output register, that single output register may operate as a cache memory. This feature boosts the speed of the data read operation from the memory cell array to the outside.

According to a further aspect of the invention, there is provided a semiconductor memory comprising a memory cell array, a row selecting circuit, a data input pin, an input register and an input data transfer circuit. The input register includes a plurality of input data retaining blocks.

The memory cell array has a plurality of memory cells arranged in a plurality of rows and a plurality of columns for storing data. The memory cells are divided into a plurality of blocks made of a plurality of columns each. The row selecting circuit receives a memory address input signal and selects the row of memory cells to be accessed in the memory cell array in accordance with the received memory address input signal. The data input pin receives externally input data over a plurality of operation cycles.

The input register retains the data input via the data input pin to be written to memory cells in the memory cell array. The multiple input data retaining blocks included in the input register correspond to the blocks of the memory cell array. Each of the input data retaining blocks retains the data to be written to the corresponding block of the memory cell array.

The input data transfer circuit receives a control signal and transfers, in accordance with that control signal, the retained data from each of the input data retaining blocks of the input register to those memory cells in the memory cell array which are selected by the row selecting circuit.

With this structure, the row selecting circuit selects the target row of memory cells from among the rows of memory cells constituting the multiple blocks of the memory cell array. The data input via the data input pin over a plurality of operation cycles is written to and retained in the data retaining blocks of the input register.

The data retained in each of the data retaining blocks of the input register is transferred therefrom by the input data transfer circuit to the memory cells on the row selected in the memory cell array.

As outlined, the semiconductor memory of the above structure utilizes the input register for collective transfer of data to the memory cells in each of the blocks of the memory cell array. With this structure, the speed of the data write operation from the outside to the memory cell array is increased regardless of the operating speed of the memory cell array.

In a preferred structure of the semiconductor memory according to the above aspect of the invention, a counter circuit may be additionally provided to receive an externally furnished clock signal defining the operation cycles and to perform a count in synchronism with that clock signal. The input register, operating on the basis of a predetermined relationship between the result of the counting by the counter circuit and the input data retaining blocks for retaining the data, may place the input data into the corresponding input data retaining block in accordance with the result of the counting.

With this preferred structure, the input data is written to and retained in the input data retaining block as per the count result from the counter circuit. The data write operation is carried out on the basis of the relationship between the count result and the input data retaining blocks.

Therefore, data is input in burst mode into the memory cell array to be written thereto. With this structure, the speed of the data write operation from the outside to the memory cell array is also increased regardless of the operating speed of the memory cell array.

In another preferred structure of the semiconductor memory according to the above aspect of the invention, the input register may receive an externally furnished chunk address input signal designating the input data retaining block for retaining the data input in each of the operation cycles, and the input register may cause the input data retaining block designated by the chunk address input signal to retain the input data.

With this preferred structure, the input register causes the data retaining block designated by the chunk address input signal from the outside to retain the externally entered data. As a result, the timing for inputting data in burst mode from the outside is controlled externally as desired.

In a further preferred structure of the semiconductor memory according to the above aspect of the invention, the memory may further comprise a plurality of output registers, a data selecting circuit, a counter circuit, a data output pin and an output data transfer circuit. Each of the output registers may include a plurality of output data retaining blocks.

The output registers each retain data read from the blocks of the memory cell array. The output data retaining blocks in each output register correspond to the blocks of the memory cell array. Each of the output data retaining blocks retains data read from the corresponding block of the memory cell array.

The data selecting circuit receives the retained data from the output data retaining blocks of each of the output registers as well as the retained data from the input data retaining blocks of the input register. The data selecting circuit then selects the data either from one of the output registers or from the input register in accordance with an externally supplied read address input signal.

The counter circuit receives an externally furnished clock signal and performs a count in synchronism with that clock signal. The data output pin outputs data to the outside.

The output data transfer circuit successively transfers the data selected by the data selecting circuit to the data output pin, thereby outputting the data over a plurality of cycles of the clock signal.

With this preferred structure, the data selecting circuit is fed not only with the retained data from any of the output registers but also with the same data transferred to memory cells in the memory cell array.

This means that, when stored data is to be read from memory cells of the memory cell array, the data held in the output registers may be selectively output in burst mode. On the other hand, if data is held in the input register and isn't yet to be written to the memory cell array, the retained data in the input register may be selectively output in burst mode.

As outlined, the preferred structure above permits burst output of the data which is held in the input register and not to be written to the memory cell array yet. This makes it possible to output data at a high speed.

According to an even further aspect of the invention, there is provided a semiconductor memory comprising a memory cell array, a data input pin, an input register, a plurality of output registers, a data output pin, a first transfer circuit, a second transfer circuit, a third transfer circuit and a fourth transfer circuit. The input register includes a plurality of input data retaining blocks. Each of the output registers comprises a plurality of output data retaining blocks.

The memory cell array has a plurality of memory cells arranged in a plurality of rows and a plurality of columns for storing data. The memory cells are divided into a plurality of blocks made of a plurality of columns each. The data input pin receives externally input data over a plurality of operation cycles.

The input register retains the data input via the data input pin to be written to memory cells in the memory cell array. The input data retaining blocks in the input register correspond to the blocks of the memory cell array. Each of the input data retaining blocks retains the data to be written to the corresponding block of the memory cell array.

The output registers each retain data read from the blocks of the memory cell array. The output data retaining blocks in each of the output registers correspond to the blocks of the memory cell array. Each of the output data retaining blocks retains data read from the corresponding block of the memory cell array. The data output pin outputs data to the outside.

The first transfer circuit transfers to the input register the data input via the data input pin. The second transfer circuit transfers the retained data from the input register to a plurality of blocks of the memory cell array. The third transfer circuit transfers to the output registers the data read from a plurality of blocks of the memory cell array. The fourth transfer circuit transfers the retained data from the output registers to the data output pin.

With this structure, the first transfer circuit transfers the externally entered data from the data input pin to the input register having the multiple input data retaining blocks. The input data is written to and retained in the input register.

The second transfer circuit transfers the retained data from the input register to memory cells in the blocks constituting the memory cell array. The data is thus written to memory cells in the memory cell array.

The third transfer circuit transfers the data from the blocks in the memory cell array to the output registers each having the multiple output data retaining blocks. The data is thus written to and retained in the output registers.

The fourth transfer circuit transfers retained data from the output registers to the data output pin. The data is then sent from the data output pin to the outside.

Operating in this manner, the semiconductor memory of the structure above permits data transfer over four routes: from the data input pin to the input register; from the input register to the blocks of the memory cell array; from the blocks of the memory cell array to the output registers; and from the output registers to the data output pin.

With this structure, data is read from the memory cell array to the outside via a plurality of output registers, and data is written from the outside to the memory cell array by way of the input register. As a result, the speed of the data read operation and that of the data write operation are increased regardless of the operating speed of the memory cell array.

In a preferred structure of the semiconductor memory according to the above aspect of the invention, two data transfer operations may take place simultaneously. One of the two data transfer operations may be performed either by the second transfer circuit or by the third transfer circuit; the other data transfer operation may be carried out either by the first transfer circuit or by the fourth transfer circuit.

With this preferred structure, data transfer is executed simultaneously over two routes: one route ranging either from the input register to the blocks of the memory cell array, or from the blocks of the memory cell array to the output registers; the other data transfer route ranging either from the data input pin to the input register, or from the output registers to the data output pin.

The preferred structure above allows data transfer operations to occur in overlapping fashion within the semiconductor memory. This feature enhances the availability of the memory cell array.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
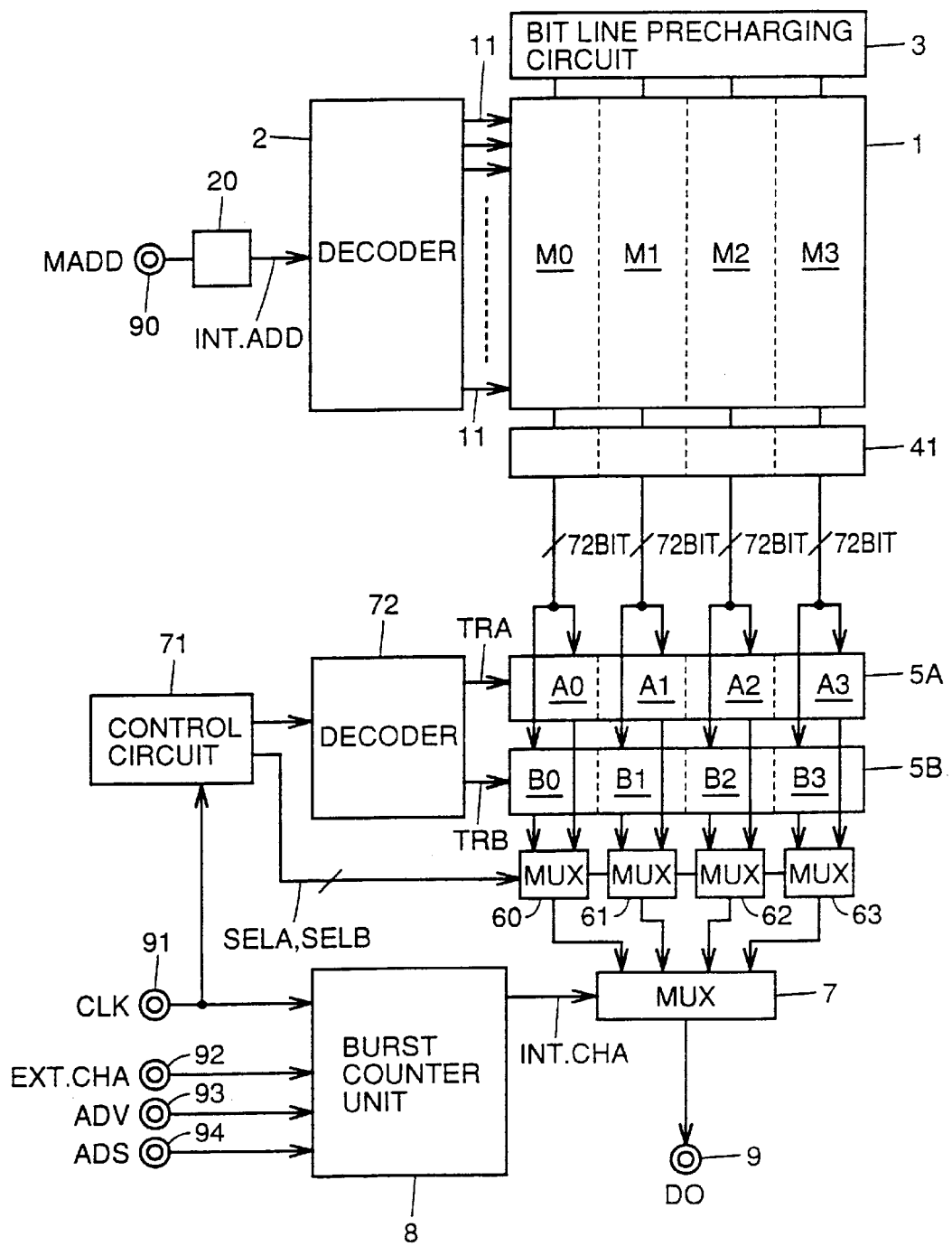
FIG. 1 is a block diagram of an SRAM practiced as a first embodiment of the invention and capable of operating in burst mode.

The preferred embodiments of the invention will now be described with reference to the accompanying drawings.
First Embodiment What follows is a description of the first embodiment comprising two output registers. FIG. 1 is a block diagram of an SRAM practiced as the first embodiment of the invention and capable of operating in burst mode. In FIG. 1, the common parts that also appear in FIG. 15 are designated by like reference numerals, and their descriptions are omitted hereunder where redundant.

Figure 15:
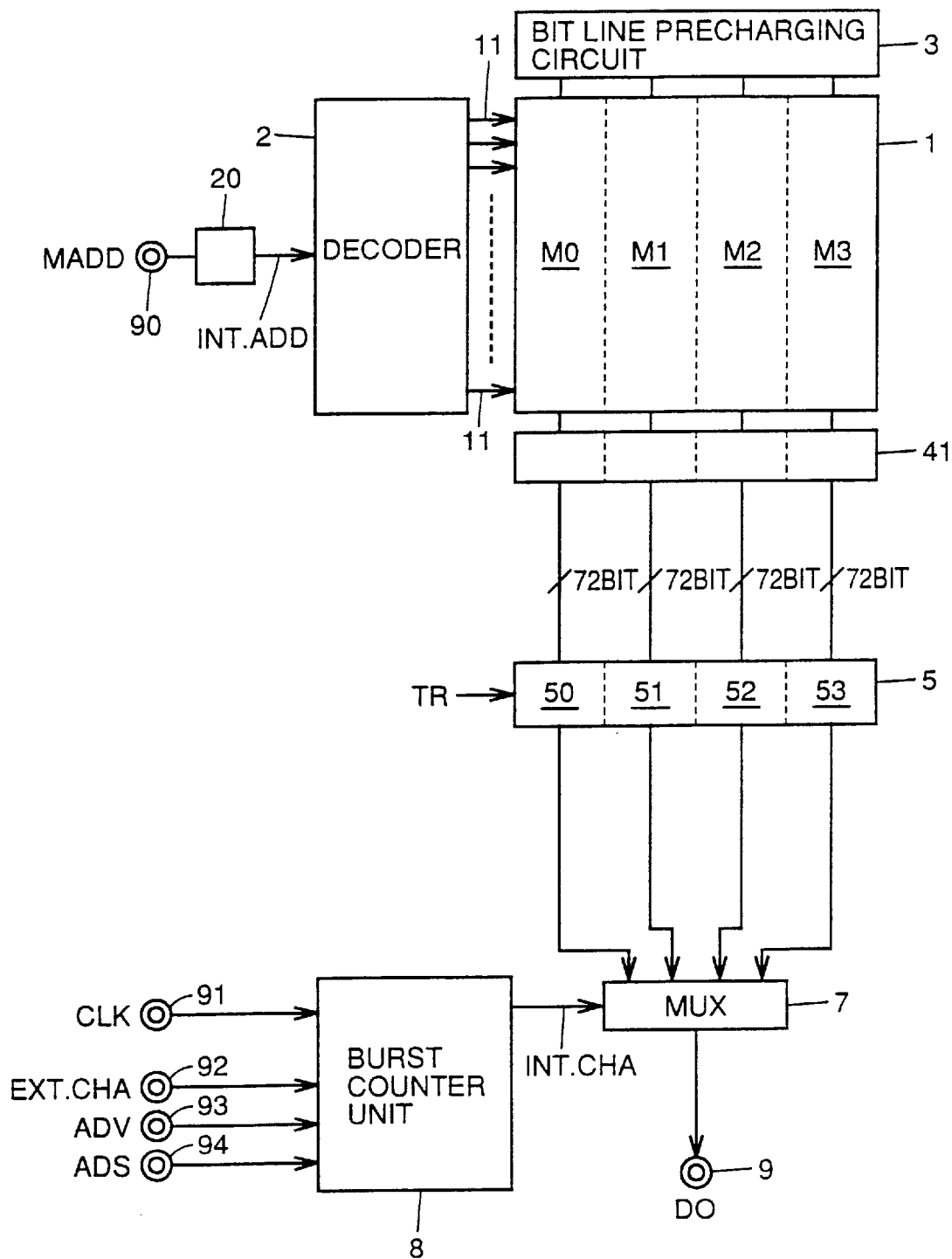
FIG. 15 is a block diagram of another conventional SRAM capable of operating in burst mode.

What makes the first embodiment of FIG. 1 different from the conventional SRAM of FIG. 15 is that the first embodiment includes two output registers 5A and 5B, multiplexers 60 through 63, a control circuit 71 and a decoder 72.

The output registers 5A and 5B are each identical in structure to the output register 5 in FIG. 15. The output register 5A is divided into four data retaining blocks A0 through A3 corresponding respectively to the memory blocks M0 through M3 in the memory cell array 1. Likewise, the output register 5B is divided into four data retaining blocks B0 through B3 corresponding respectively to the memory blocks M0 through M3 in the memory cell array 1.

A 72-bit data item read from the memory block M0 and amplified by the sense amplifier 41 is transferred selectively to the data retaining blocks A0 and B0. Another 72-bit data item read from the memory block M1 and amplified by the sense amplifier 41 is transferred selectively to the data retaining blocks A1 and B1.

A 72-bit data item read from the memory block M2 and amplified by the sense amplifier 41 is transferred selectively to the data retaining blocks A2 and B2. Another 72-bit data item read from the memory block M3 and amplified by the sense amplifier 41 is transferred selectively to the data retaining blocks A3 and B3.

Each of the data retaining blocks in the output register 5A receives a transfer signal TRA, to be described later. When the transfer signal TRA is activated, the signal causes the corresponding data retaining block to retain the data fed from the sense amplifier 41. That is, activating the transfer signal TRA carries out data transfer to the output register 5A.

Each of the data retaining blocks in the output register 5B receives a transfer signal TRB, to be discussed later. When the transfer signal TRB is activated, the signal causes the corresponding data retaining block to retain the data sent from the sense amplifier 41. That is, activating the transfer signal TRB executes data transfer to the output register 5B.

The multiplexers 60 through 63 are furnished to correspond respectively with the data retaining blocks A0 through A3 in the output register 5A as well as with the data retaining blocks B0 through B3 in the output register 5B.

The multiplexers 60 through 63 each receive the retained data from the corresponding data retaining blocks in the output register 5A and 5B. When responding to selection signals SELA and SELB, to be described later, each of the multiplexers 60 through 63 forwards the corresponding data selectively to the multiplexer 7.

The control circuit 71 is a sequence circuit capable of distinguishing the output register 5A from the output register 5B for alternate selection thereof. The control circuit 71 receives a clock signal CLK. In response to the clock signal CLK, the control circuit 71 supplies the decoder 72 with a control signal that controls the decoder. The control circuit 71 also controls each of the multiplexers 60 through 63 by feeding the selection signals SELA and SELB thereto.

The selection signal SELA is a signal that causes each of the multiplexers 60 through 63 selectively to output data from the corresponding data retaining block of the output register 5A.

The selection signal SELB causes each of the multiplexers 60 through 63 selectively to output data from the corresponding data retaining block of the output register 5B.

The decoder 72 receives its control signal from the control circuit 71. In response to the control signal, the decoder 72 supplies the output register 5A with the transfer signal TRA ordering the transfer of data from the sense amplifier 41 to the output register 5A; the decoder 72 also supplies the output register 5B with the transfer signal TRB ordering the transfer of data from the sense amplifier 41 to the output register 5B.

In the SRAM of the above constitution, data is transferred alternately to the output registers 5A and 5B. This means that while data is being output to the outside from one output register, data may be transferred from memory cells to the other output register.

Figure 2:
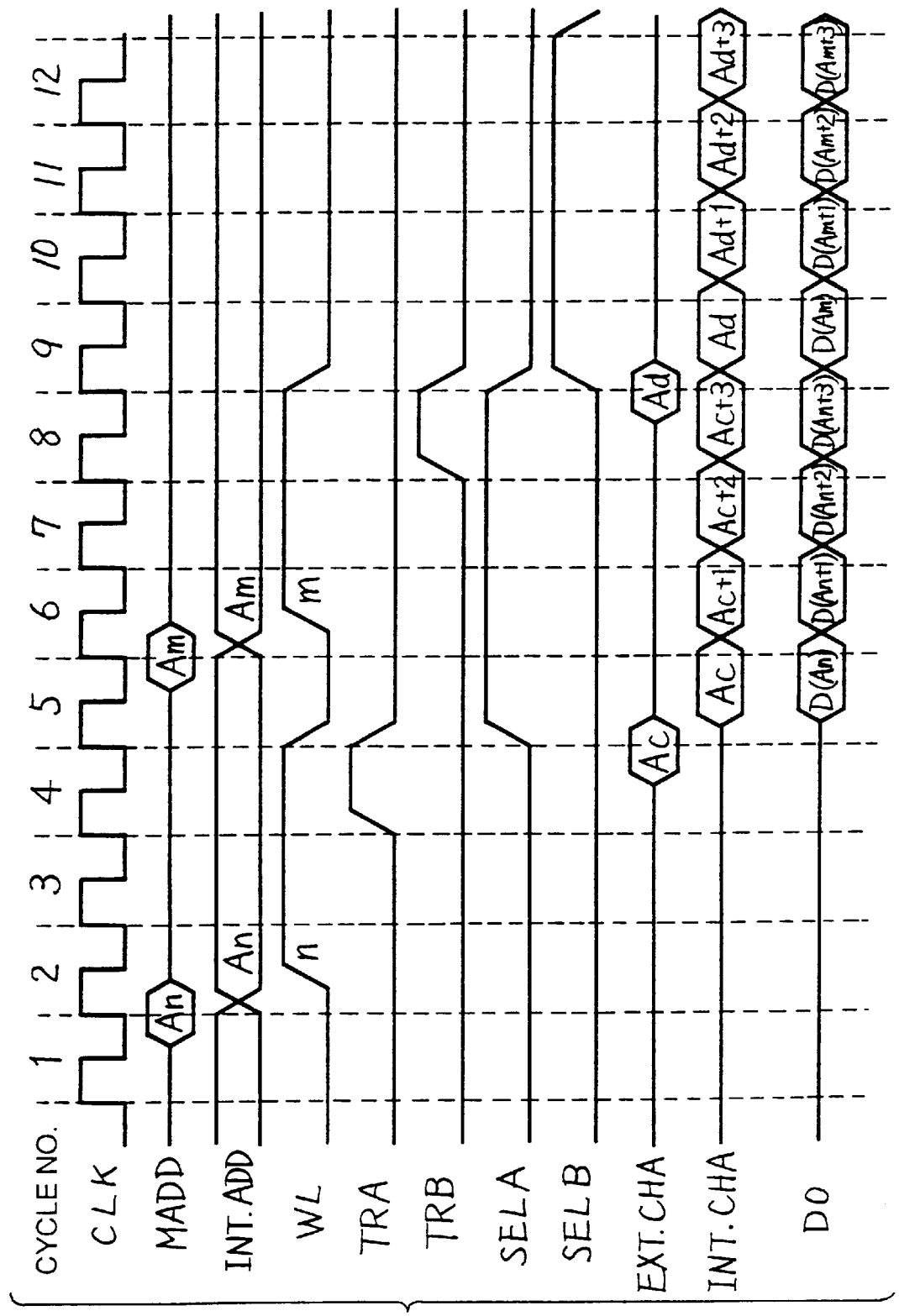
FIG. 2 is a timing chart showing typical waveforms of signals used by the first embodiment of FIG. 1 in a data read operation.

How the first embodiment (i.e., SRAM) of FIG. 1 works in a read operation will now be described. FIG. 2 is a timing chart showing typical waveforms of signals used by the first embodiment in the data read operation. In the description that follows, the signal-related workings that were already discussed with reference to FIG. 16 are omitted hereunder where redundant.

Figure 16:
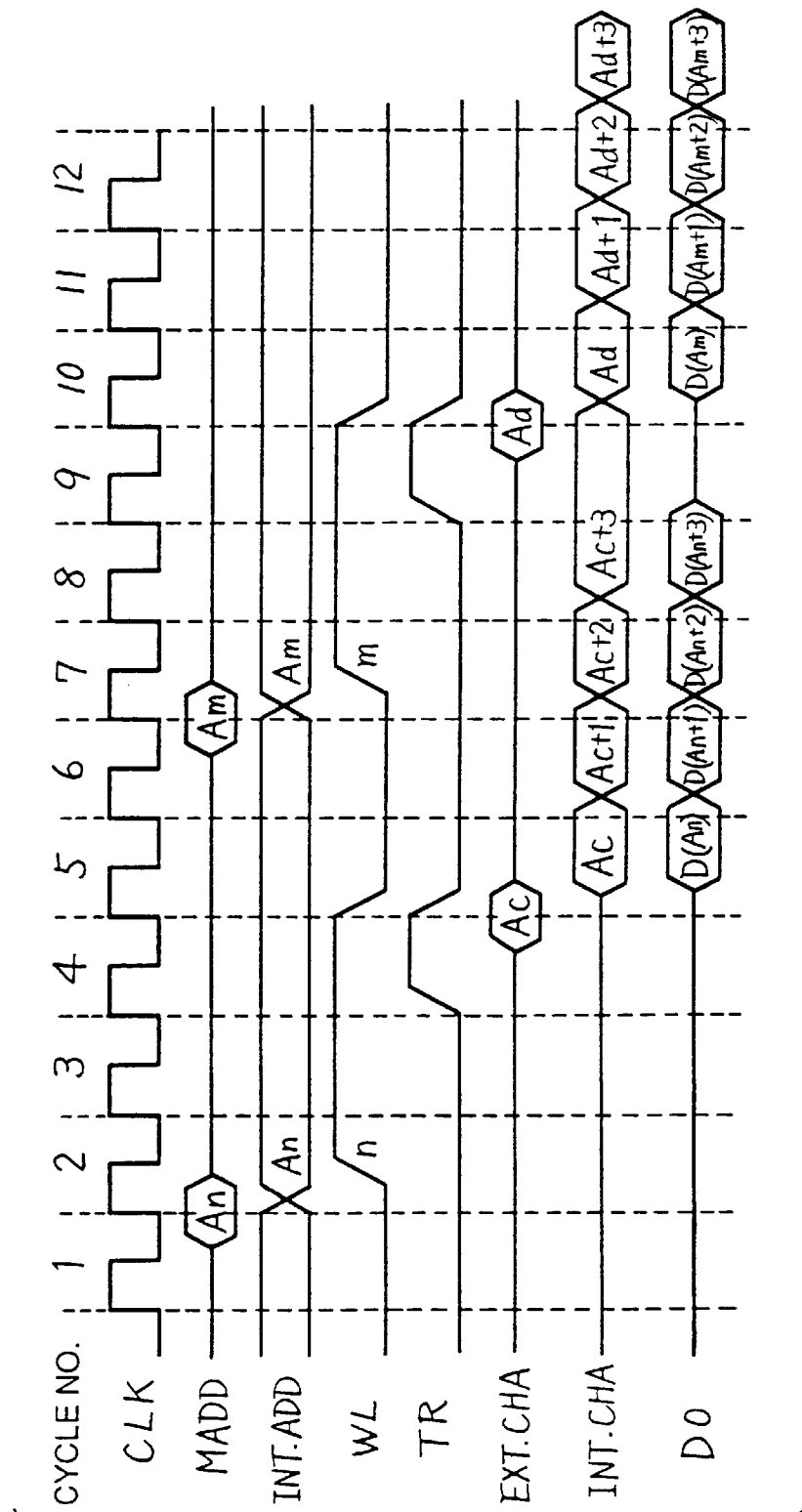
FIG. 16 is a timing chart showing typical waveforms of signals used by the conventional SRAM of FIG. 15 in a data read operation.

Referring to FIG. 2, what takes place in the first through the third cycle is the same as that which occurs in the first through the third cycle in FIG. 16. In the fourth cycle, the transfer signal TRA is brought High. In response, data is transferred to and retained in the data retaining blocks A0 through A3 of the output register 5A.

In the fifth through the eighth cycle, the selection signal SELA is driven High. In response, the retained data in the data retaining blocks A0 through A3 of the output register 5A is selected respectively by the multiplexers 60 through 63 and sent to the multiplexer 7.

The multiplexer 7 receives the data from each of the multiplexers 60 through 63. Given an internal chunk address signal INT.CHA based on the address Ac of the external chunk address signal EXT.CHA, the multiplexer 7 outputs the received data in burst mode in the fifth through the eighth cycle.

Concurrently with the burst output, the transfer signal TRB is driven High in the eighth cycle. In response, the data to be output next in burst mode is transferred from the memory cell array 1 to the data retaining blocks B0 through B3 of the output register 5B. The transferred data is retained in these data retaining blocks.

In preparation for the above kind of data transfer, the next address Am designated by the memory address signal MADD is input one cycle earlier with the first embodiment than with the conventional SRAM of FIG. 16. Correspondingly, the internal address signal INT.ADD and the word line 11 (WL) vary in status one cycle earlier with the first embodiment than with the conventional SRAM.

In the ninth through the 12th cycle, the selection signal SELB is brought High. In response, the data retained in the data retaining blocks B0 through B3 of the output register 5B is selected respectively by the multiplexers 60 through 63 and sent to the multiplexer 7.

The multiplexer 7 receives the data from each of the multiplexers 60 through 63. Given the internal chunk address signal INT.CHA based on the address Ad of the external chunk address signal EXT.CRA, the multiplexer 7 outputs the received data in burst mode in the ninth through the 12th cycle.

Thereafter, the read data is transferred alternately to the output registers 5A and 5B. This scheme allows one output register to output the retained data in burst mode while the other output register receives data transferred thereto. The burst output and the data transfer are repeated alternately.

As described, the SRAM practiced as the first embodiment of the invention comprises two output registers. The two output registers are utilized alternately for burst output therefrom and for data transfer thereto from the memory cell array 1. The circuit workings permit uninterrupted burst output of data. With the first embodiment, this benefit is supplemented by another advantageous effect.

That is, two conventionally related time periods are made independent of each other by the first embodiment. One of the two time periods is the cycle time of the clock signal CLK. The other is the period from the time the address of the memory address signal MADD is input until the data read from the memory cell array 1 is sufficiently amplified by the sense amplifier 41.

With the above two time periods dissociated from each other, the shortest possible data transfer period is allowed to be adopted. This in turn helps boost the speed of the read operation. Even though the operation speed of the memory cell array 1 is low, a high-speed read operation may be realized. This eliminates the need for the memory to use illustratively the so-called bipolar CMOS LSI technology, an expensive process technique for enhancing the operation speed of the memory cell array 1. As a result, the invention allows semiconductor memories adopting low-cost process techniques to perform high-speed read operations.

Second Embodiment

The second embodiment of the invention will now be described. This embodiment comprises three or more output registers.

Figure 3:
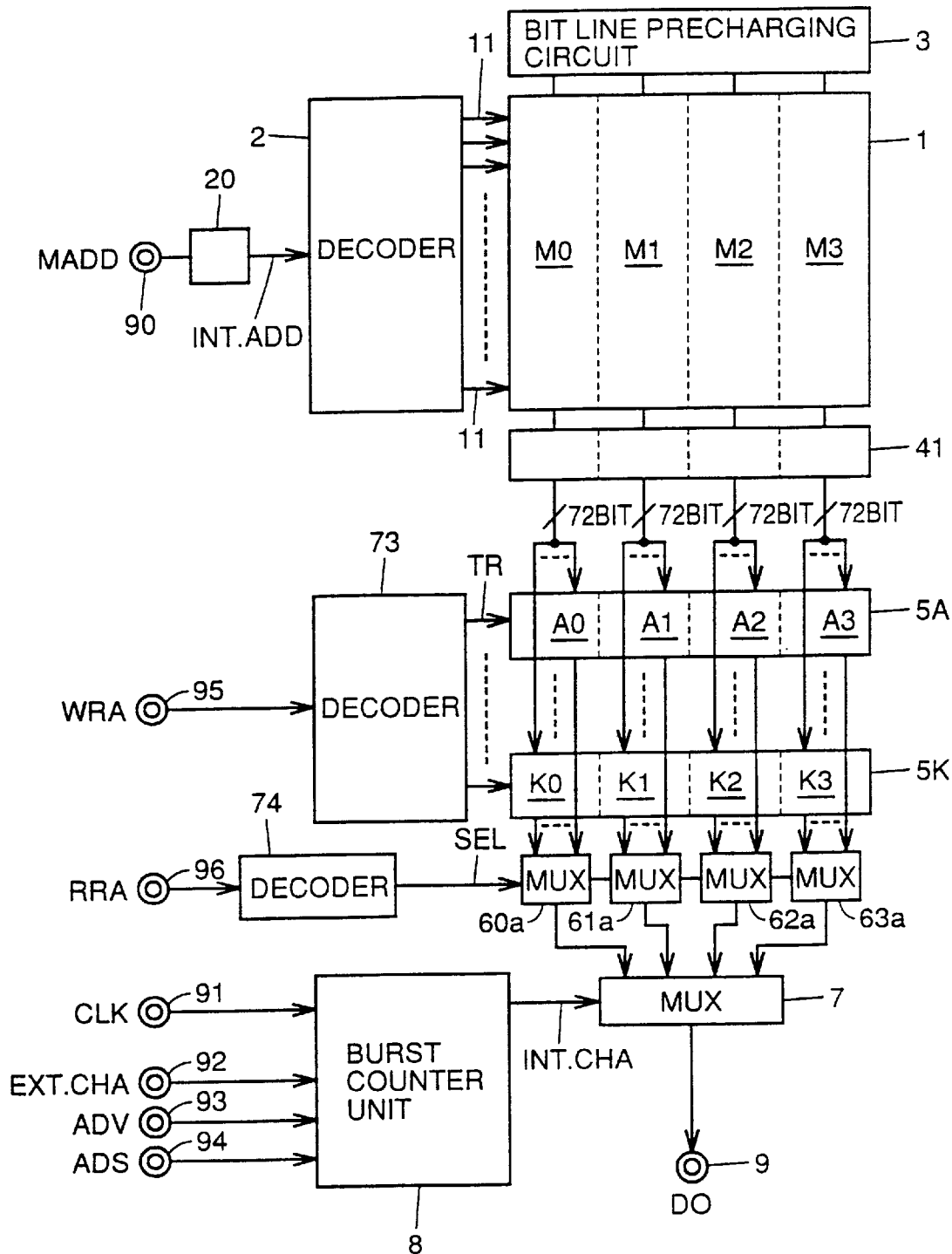
FIG. 3 is a block diagram of an SRAM practiced as a second embodiment of the invention and capable of operating in burst mode.

FIG. 3 is a block diagram of an SRAM practiced as the second embodiment of the invention and capable of operating in burst mode. In FIG. 3, the common parts that also appear in FIG. 1 are designated by like reference numerals, and their descriptions are omitted hereunder where redundant.

The second embodiment (i.e., SRAM) of FIG. 3 differs from the SRAM of FIG. 1 in the following points: three or more output registers 5A through 5K are provided instead of the two output registers 5A and 5B. The multiplexers 60 through 63 of FIG. 1 are replaced by multiplexers 60a trough 63a, each of which selects one of a different number of output registers. The control circuit 71 is not provided. The decoder 72 is replaced by a decoder 73. A decoder 74 is furnished to generate a selection signal SEL for controlling the multiplexers 60a through 63a.

Each of the output registers 5A through 5K is identical in structure to the output registers 5A and 5B in FIG. 1. The decoder 73 receives a write register address signal WRA from the outside via an input pin 95.

The write register address signal WRA is used to designate one of the output registers 5A through 5K. The selected output register receives data and has it written thereto. The decoder 73 supplies each of the output registers 5A through 5K with the transfer signal TR in response to the write register address signal WRA.

The decoder 74 receives a read register address signal RRA from the outside via an input pin 96. The read register address signal RRA causes each of the multiplexers 60a through 63a to designate the output register from which to read data. Given the read register address signal RRA, the decoder 74 supplies each of the multiplexers 60a through 63a with the selection signal SEL for selecting one of the output registers 5A through 5K.

Each of the multiplexer 60a through 63a receives data from the corresponding data retaining block in each of the output registers 5A through 5K. In responding to the selection signal SEL, each of the multiplexers 60a through 63a selects one output register from which to read data. From the corresponding data retaining block in the selected register, the retained data is supplied to the multiplexer 7.

Figure 4:
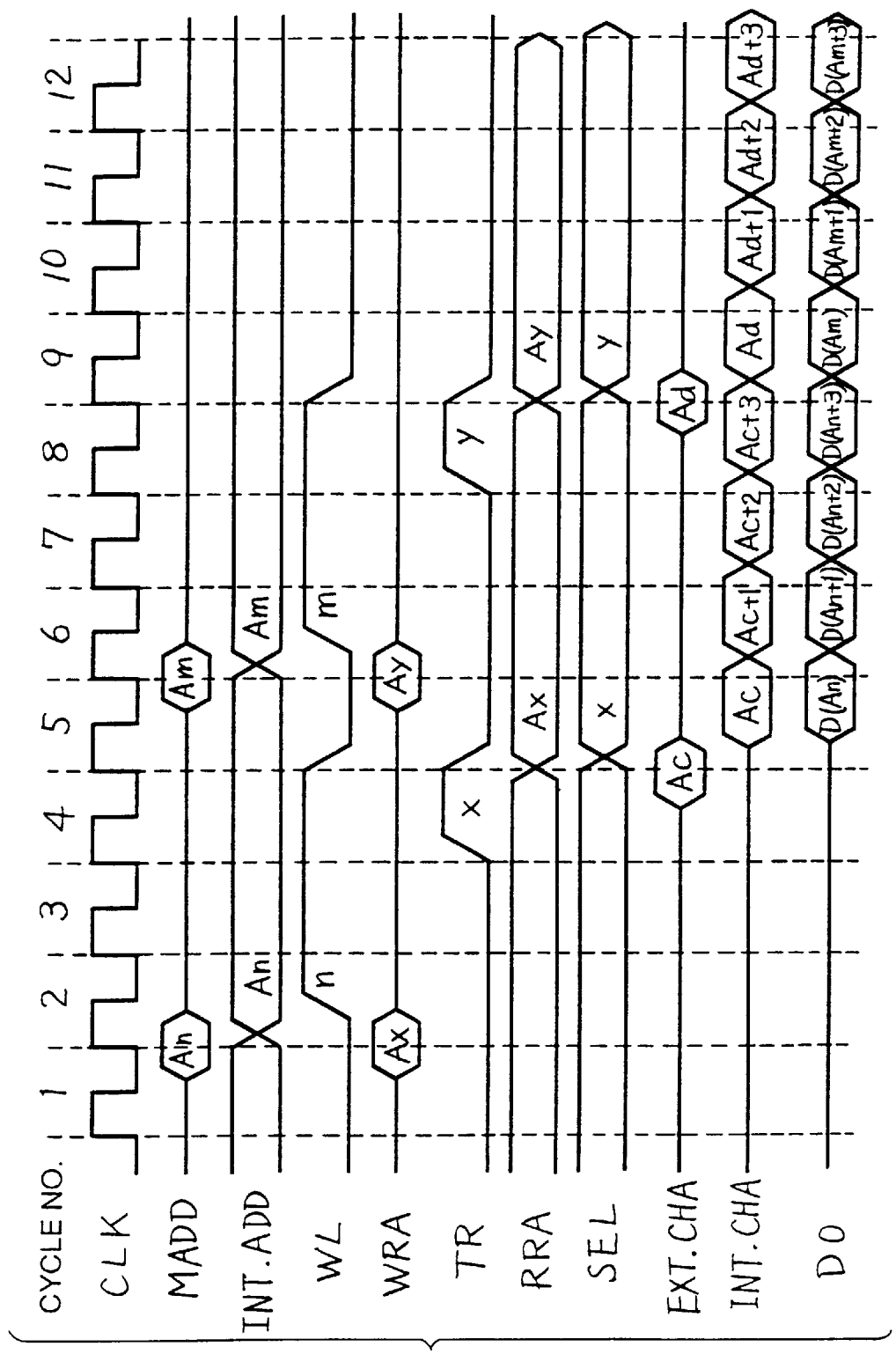
FIG. 4 is a timing chart showing typical waveforms of signals used by the second embodiment of FIG. 3 in a data read operation.

How the second embodiment (i.e., SRAM) of FIG. 3 works will now be described. FIG. 4 is a timing chart showing typical waveforms of signals used by the second embodiment in a data read operation. In the description that follows, the signal-related workings that were already discussed with reference to FIG. 2 are omitted hereunder where redundant.

Referring to FIG. 4, the address An designated by the memory address signal MADD is admitted into the internal register 20 at a first leading edge of the clock signal CLK in the second cycle. Simultaneously, the address Ax designated by the write register address signal WRA is admitted into the decoder 73. The address Ax is used to designate one of the output registers 5A through 5K.

In the fourth cycle, the data amplified by the sense amplifier 41 is transferred to one output register designated by the address Ax of the write register address signal WRA. The data transfer takes place as follows: the transfer signal TR(x) is first driven High. In response, one of the output registers 5A through 5K receives the amplified data transferred thereto. The transferred data is retained in that output register.

The read register address signal RRA is then input to the decoder 74 for selecting the output register from which to transfer data to the data input/output pin 9. Given the read register address signal RRA, the decoder 74 supplies the multiplexers 60a through 63a with a selection signal SEL(x) for selecting the output register corresponding to the address Ax designated by the signal RRA.

The address Ax designated by the read register address signal RRA is used to designate one of the output registers 5A through 5K form which to read the retained data.

In response to the selection signal SEL(x), the multiplexers 60a through 63a select the data retained in the respective data retaining blocks in the designated single output register. The selected data is fed to the multiplexer 7.

Given the internal chunk address signal INT.CHA sent from the burst counter unit 8, the multiplexer 7 successively transfers to the data input/output pin 9 the data fed from the multiplexers 60a through 63a. This allows the data input/output pin 9 to output the transferred data in burst mode.

In the sixth cycle, the address Am designated by the memory address signal MADD and the address signal Ay designated by the write register address signal WRA are admitted. In response to these addresses, the above-described actions are carried out continuously. This allows the data corresponding to the address Am to be output uninterrupted in burst mode.

The SRAM practiced as the second embodiment includes three or more output registers. This constitution provides one advantage identical to that of the first embodiment, i.e., the ability to execute data burst output in uninterrupted fashion.

The second embodiment provides another advantage when equipped illustratively with three output registers in a specific control setup. How this setup with its three output registers works will now be described in detail.

Of the three output registers, the first register is used to retain fixedly the data read from a specific row of memory cells frequently accessed. The second and third output registers are employed to carry out the uninterrupted burst output of data discussed in connection with the first embodiment.

Where the address representing the data held in the first output register is to be accessed, the corresponding row of memory cells in the memory cell array 1 is not accessed. Instead, the retained data in the first output register is output therefrom.

In this control setup, the memory cell array 1 is not used while data is being read from the first output register. This means that, concurrently with the data read operation from the first output register during this period, data may be written to memory cells in the memory cell array 1 or transferred from memory cells in the memory cell array 1 to another output register.

Where three or more output registers are provided as described, one of them is used to output frequently used data without gaining access to memory cells in the memory cell array 1. This setup further helps increase the speed of the data read operation. As a result, the overall performance of the semiconductor memory is enhanced.

The operation above is accomplished by use of a complex control scheme implemented as desired from the outside. Such control is made possible by externally supplying the memory with the write register address signal WRA and the read register address signal RRA. In a typical computer system, these signals WRA and RRA may be supplied from an external unit such as the host MPU.

Third Embodiment

The third embodiment of the invention will now be described. This embodiment is characterized by its ability to write collectively to memory cells a series of data being entered over a plurality of operation cycles.

Figure 5:
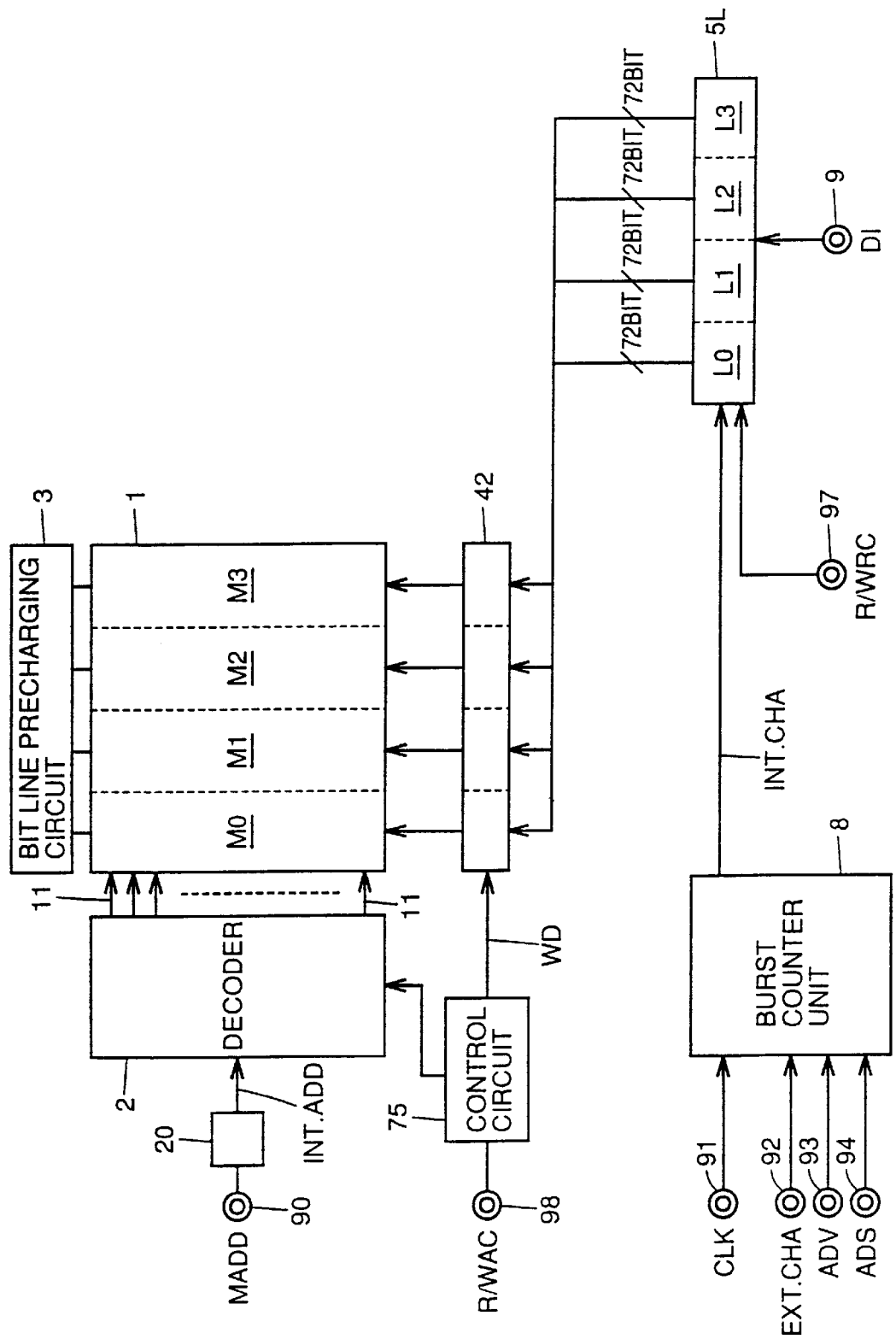
FIG. 5 is a block diagram of an SRAM practiced as a third embodiment of the invention and capable of operating in burst mode.

FIG. 5 is a block diagram of an SRAM practiced as the third embodiment and capable of operating in burst mode. In FIG. 5, the common parts that also appear in FIG. 1 are designated by like reference numerals, and their descriptions are omitted hereunder where redundant. FIG. 5 omits the data read circuit portion included in FIG. 1 and illustrates instead a data write circuit portion.

Referring to FIG. 5, the third embodiment (i.e., SRAM) of FIG. 5 differs from the first embodiment of FIG. 1 in the following points: the data read circuit components such as the output registers 5A and 5B, multiplexers 60 through 63, control circuit 71 and decoder 72 shown in FIG. 1 are all omitted. The data write circuit components including an input register 5L, a write driver 42 and a control circuit 75 are depicted instead.

The input register 5L is identical in structure to the output register 5A or 5B in FIG. 1. That is, the register is divided into four data retaining blocks L0 through L3 corresponding to the memory blocks M0 through M3 of the memory cell array 1.

The input register 5L receives input data DI being entered over a plurality of cycles via the data input/output pin 9. The input register 5L also receives as its control signals the internal chunk address signal INT.CHA from the burst counter unit 8 and a register read/write control signal R/WRC input via an input pin 97.

The register read/write control signal R/WRC is a control signal that designates whether or not to write the input data DI to the input register 5L. Given the signal R/WRC, the input register 5L is made to accept or reject the input data DI destined thereto. If the register read/write control signal R/WRC specifies that the input data DI be written to the input register 5L, the input data DI is written successively to the data retaining blocks L0 through L3 over a plurality of operation cycles in response to the internal chunk address signal INT.CHA.

The input register 5L has the written data retained in its data retaining blocks. FIG. 5 shows an example in which each of the data retaining blocks in the input register 5L retains a 72-bit data item.

The data retained in the data retaining blocks L0 through L3 of the input register 5L is transferred to the respective memory blocks M0 through M3 via the write driver 42 using an appropriate timing. The transferred data is written to memory cells in the memory blocks M0 through M3.

The data transfer operation in the case above is controlled by the control circuit 75. The control circuit 75 receives an array read/write control signal R/WAC from the outside via an input pin 98. In responding to the control signal R/WAC thus received, the control circuit 75 supplies a write driver control signal WD to the write driver 42.

Given the write driver control signal WD, the write driver 42 transfers in a simultaneous and collective manner the retained data from the data retaining blocks L0 through L3 of the input register 5L to the memory blocks M0 through M3 of the memory cell array 1. The data thus transferred to the memory blocks M0 through M3 is written to the single row of memory cells connected to the word line 11 selected by the decoder 2.

Figure 6:
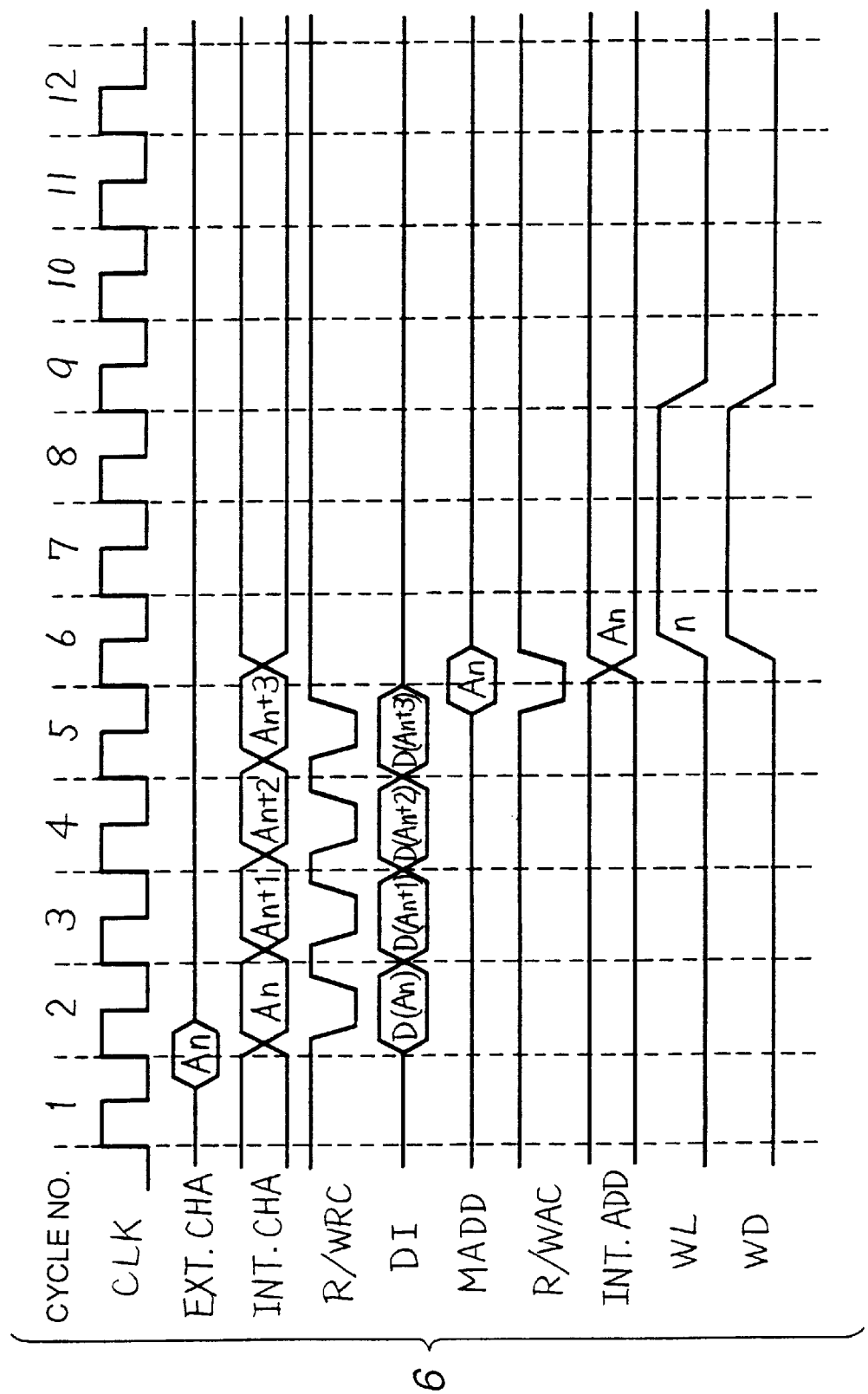
FIG. 6 is a timing chart showing typical waveforms of signals used by the third embodiment of FIG. 5 in a data write operation.

How the third embodiment (i.e., SRAM) of FIG. 5 works will now be described. FIG. 6 is a timing chart showing typical waveforms of signals used by the third embodiment in a data write operation.

Referring to FIG. 6, data is written to the input register 5L in the second through the fifth cycle. Initially, the address An designated by the external chunk address signal EXT.CHA is admitted into the burst counter unit 8 at a first leading edge of the clock signal CLK in the second cycle. In the notation of the address An, reference character n represents the numeral part of the reference characters L0 through L3 indicating the data retaining blocks of the input register 5L.

That is, addresses An, An+1, An+2 and An+3 designated by the internal chunk address signal INT.CHA output by the burst counter part 8 based on the external chunk address signal EXT.CHA constitute information designating the data retaining blocks L0, L1, L2 and L3, respectively, in the input register 5L.

After the address An is input, the register read/write control signal R/WRC is brought Low to become an active pulse signal. This pulse signal is brought Low every time the internal chunk address signal INT.CHA is changed in status.

In the input register 5L, every time the register read/write control signal R/WRC is brought Low, the input data DI is written successively to each of the data retaining blocks corresponding to the addresses designated by the internal chunk address signal INT.CHA.

In the sixth cycle, the array read/write control signal R/WAC is driven Low for a predetermined period of time. The write driver control signal WD is brought High in the sixth through the eighth cycle. Bringing the write driver control signal WD High causes the write driver 42 to send the retained data from the input register 5L to the memory blocks M0 through M3 in a simultaneous and collective manner.

The moment the array read/write control signal R/WAC is driven Low in the sixth cycle, the address An designated by the memory address signal MADD is admitted into the internal register 20 simultaneously.

With the address An thus supplied, the address An designated by the internal address signal INT.ADD is fed to the decoder 2. In response, the word line 11 (WL) is brought High in the sixth through the eighth cycle. During these cycles, the data transferred to the memory cell array 1 is written to memory cells of the respective memory cell blocks.

FIG. 6 illustrates a control scheme whereby data transfer to the memory cell array 1 is started in the sixth cycle immediately after the writing of data to the input register 5L.

However, this scheme is only an example and is not limitative of the invention. Alternatively, the transfer of data to the memory cell array 1 may be started later than the sixth cycle. This is because the input register 5L continuously retains its data from the sixth cycle onward and is thus ready for such data transfer from that point on.

Furthermore, suppose that it is necessary, by the beginning of the eighth cycle at the latest, to prepare the data to be written to memory cells in the memory cell array 1. In that case, it is possible to start the writing of data to the memory cell array 1 two cycles earlier than in the setup of FIG. 6.

The SRAM practiced as the third embodiment includes the input register 5L which allows data to be written in burst mode. This boosts the speed of the data write operation. If an SRAM permitting burst output in a data read operation includes an input register such as the register 5L of the third embodiment, the data write operation may be carried out as rapidly as the data read operation.

Fourth Embodiment

The fourth embodiment of the invention will now be described. This embodiment is a variation of the third embodiment discussed above.

Figure 7:
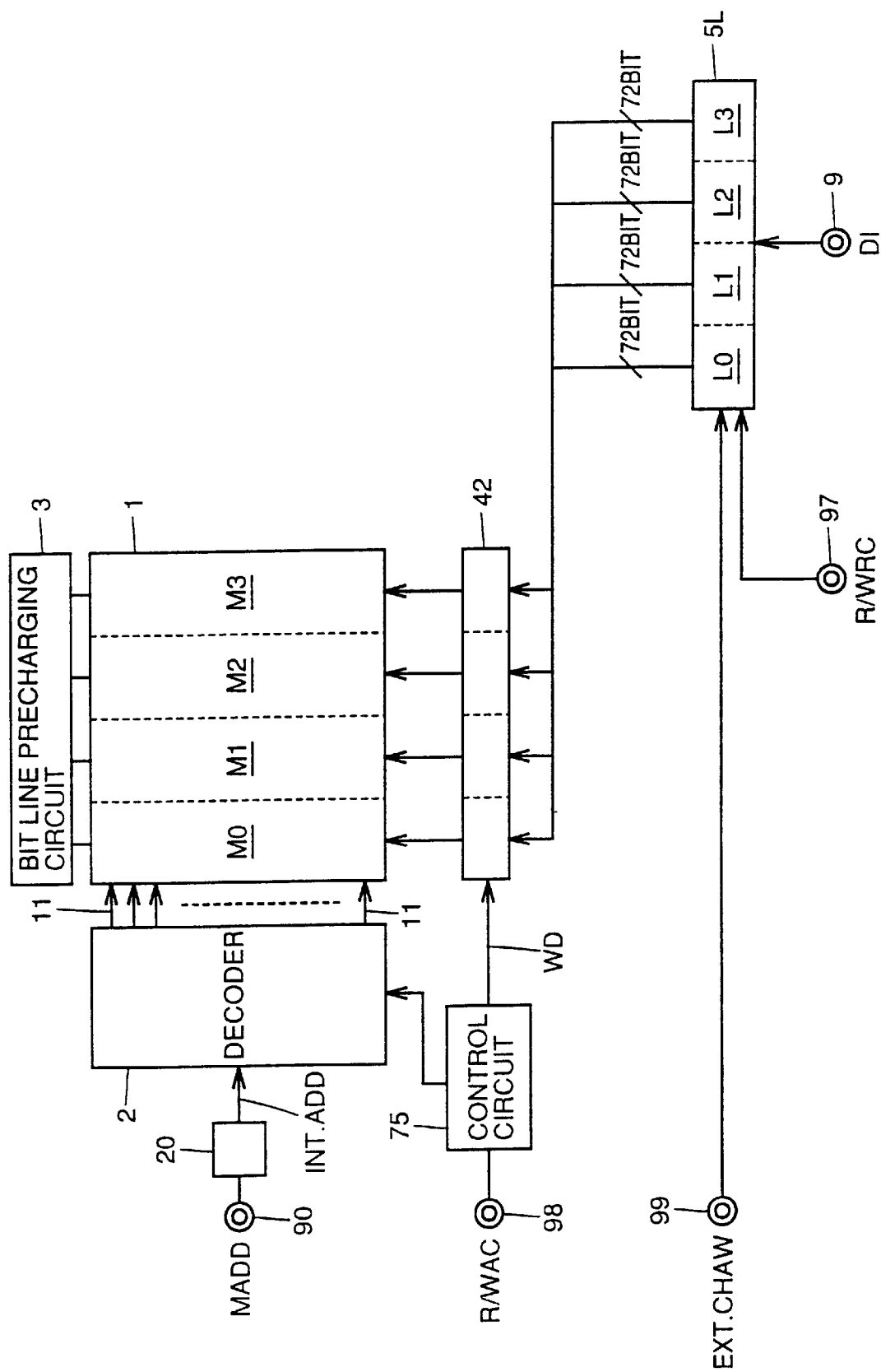
FIG. 7 is a block diagram of an SRAM practiced as a fourth embodiment of the invention and capable of operating in burst mode.

FIG. 7 is a block diagram of an SRAM practiced as the fourth embodiment of the invention and capable of operating in burst mode. In FIG. 7, the common parts that also appear in FIG. 5 are designated by like reference numerals, and their descriptions are omitted hereunder where redundant.

The fourth embodiment (i.e., SRAM) of FIG. 7 differs from the third embodiment of FIG. 5 in the following points: the burst counter unit 8 is not provided, and an external write chunk address signal EXT.CHAW is used as the control signal of the input register 5L.

As with the internal chunk address signal INT.CHA in FIG. 6, the external write chunk address signal EXT.CHAW has its address varied in each cycle of the clock signal CLK. That is, the external write chunk address signal EXT.CHAW is in synchronism with the clock signal CLK that stipulates the operation cycles of the SRAM. The signal EXT.CHAW is fed to the input register 5L from the outside via an input pin 99.

On receiving the external write chunk address signal EXT.CHAW, the input register 5L successively changes the data retaining block to which to write data.

Figure 8:
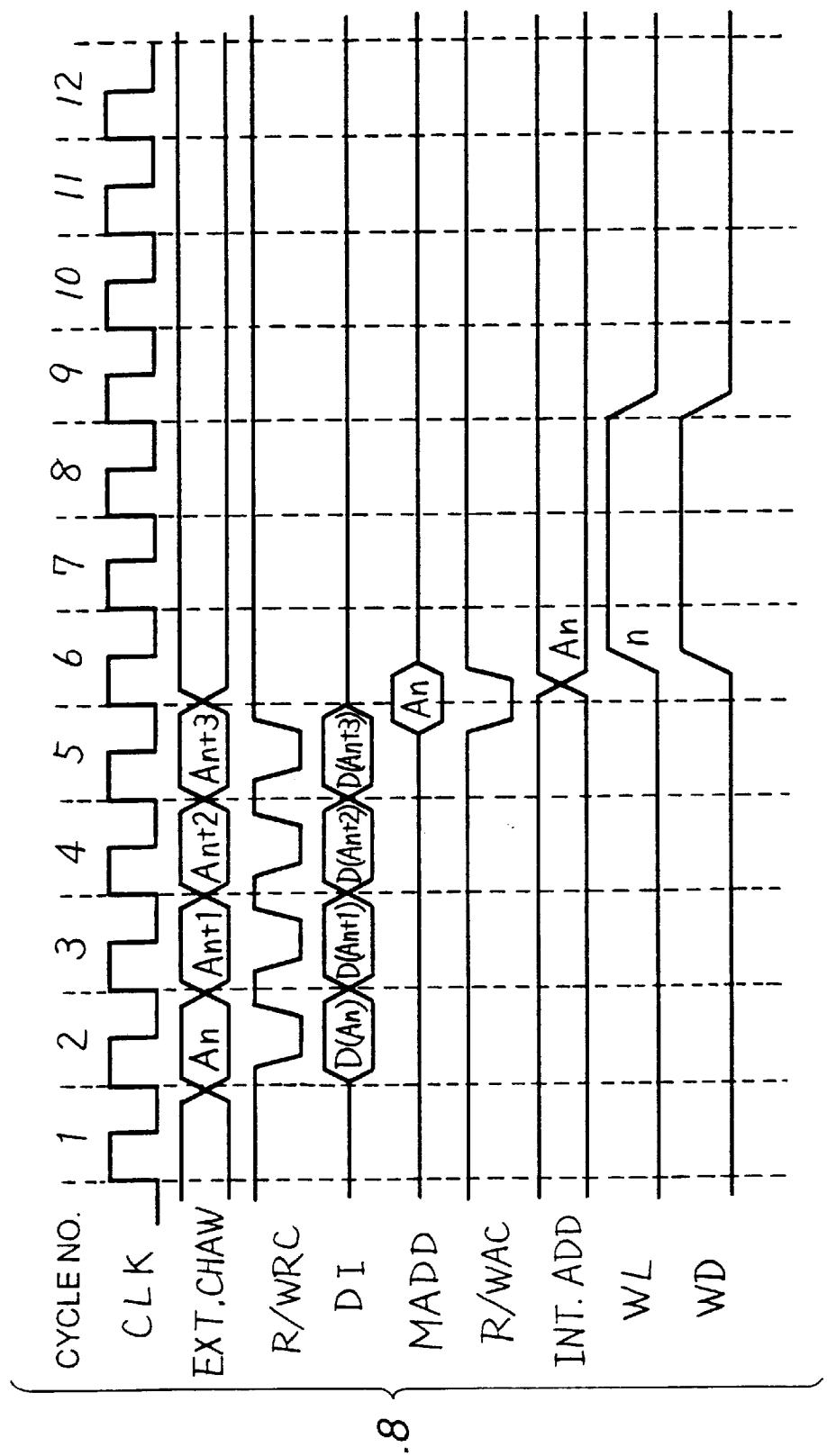
FIG. 8 is a timing chart showing typical waveforms of signals used by the fourth embodiment of FIG. 7 in a data write operation.

How the fourth embodiment (i.e., SRAM) of FIG. 7 works will now be described. FIG. 8 is a timing chart showing typical waveforms of signals used by the fifth embodiment in a data write operation. In the description that follows, the signal-related workings that were already discussed with reference to FIG. 6 are omitted hereunder where redundant.

What makes the timing chart of FIG. 8 different from that of FIG. 6 is the presence of the external write chunk address signal EXT.CHAW. As shown in FIG. 8 and as with the internal chunk address signal INT.CHA in FIG. 6, the external write chunk address signal EXT.CHAW has its address varied in synchronism with the clock signal CLK.

This allows the fourth embodiment (SRAM) of FIG. 7 to have data written thereto in burst mode, as in the case of the third embodiment (SRAM) of FIG. 5.

Because the fourth embodiment permits writing of data in burst mode like the third embodiment, the fourth embodiment offers the same beneficial effect as the third embodiment. In addition, the fourth embodiment provides another advantage.

That is, the writing of data to memory cells in the memory cell array 1 is not necessarily executed in accordance with the burst sequence based on the count result from the burst counter unit.

Thus when the external write chunk address signal EXT.CHAW is supplied from the outside, the writing of data in burst mode to the memory may be controlled by an external device as desired.

Fifth Embodiment

The fifth embodiment of the invention will now be described. This embodiment is a combination of some of the embodiments described so far. Specifically, the fifth embodiment is an SRAM that allows data write and read operations to be executed in an overlapping manner.

Figure 9:
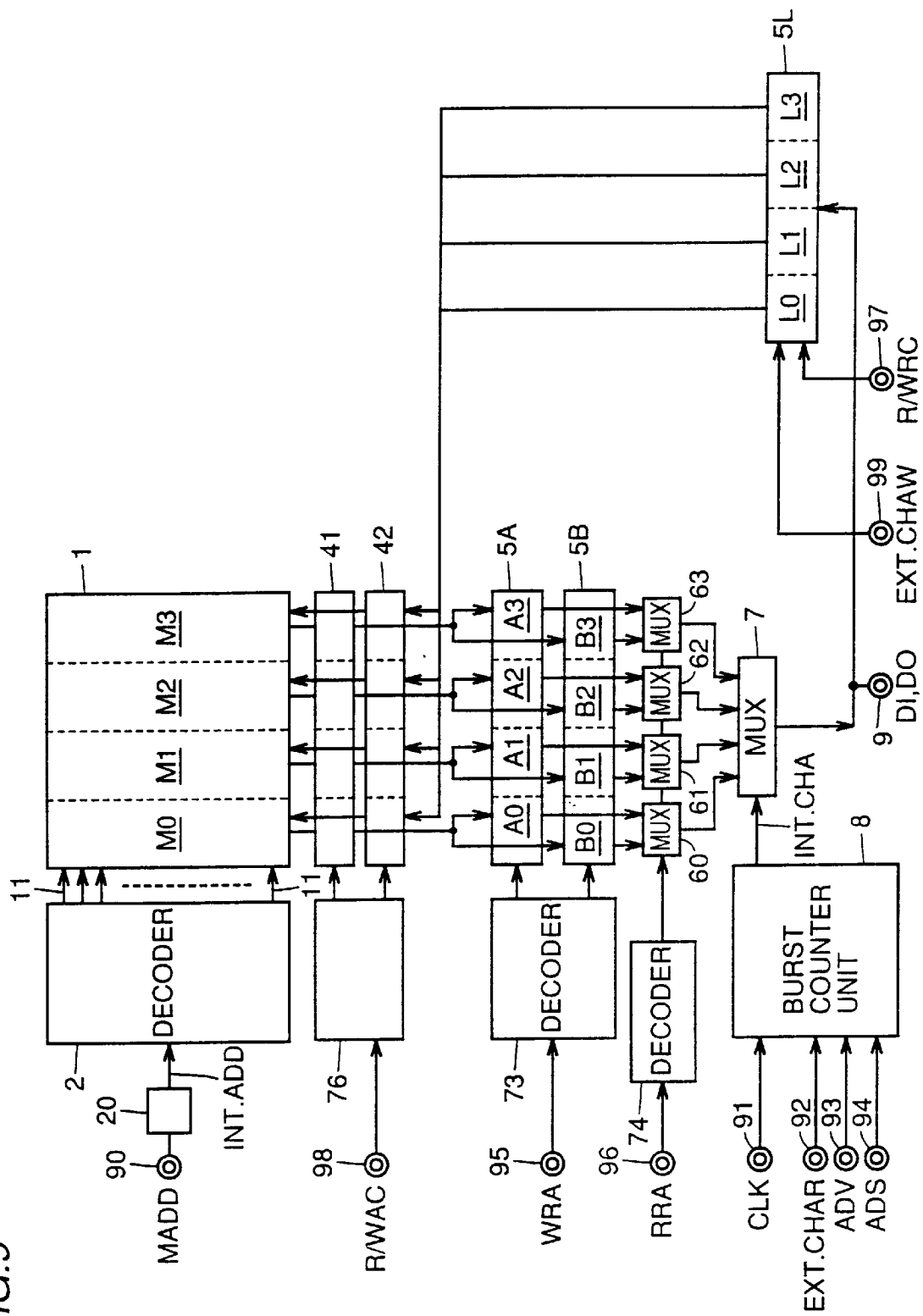
FIG. 9 is a block diagram of an SRAM practiced as a fifth embodiment of the invention and capable of operating in burst mode.

FIG. 9 is a block diagram of an SRAM practiced as the fifth embodiment of the invention and capable of operating in burst mode. The SRAM of FIG. 9 combines a read and a write circuit. The read circuit is a circuit that carries out the reading of data from the memory cell array 1 in an SRAM similar to that of FIG. 3 wherein the output registers 5A through 5K are replaced by two output registers 5A and 5B. The write circuit is one which executes the writing of data to the memory cell array 1 in an SRAM similar to that of FIG. 7. The combination of the read and the write circuit is supplemented by a newly added control circuit 76.

In the SRAM of FIG. 9, the common parts that also appear in the SRAMs of FIGS. 3 and 7 are designated by like reference numerals, and their descriptions are omitted hereunder where redundant.

Referring to FIG. 9, the control circuit 76 receives the array read/write control signal R/WAC from the outside. In response, the control circuit 76 activates the sense amplifier 41 or the write driver 42 selectively. The sense amplifier 41 is selected for a data read operation, and the write driver 42 is selected for a data write operation. In other words, the array read/write control signal R/WAC is a signal for selecting either the sense amplifier 41 or the write driver 42.

In the SRAM of FIG. 9 thus constituted, data is read from the memory cell array 1 or written thereto in burst mode.

Figure 10:
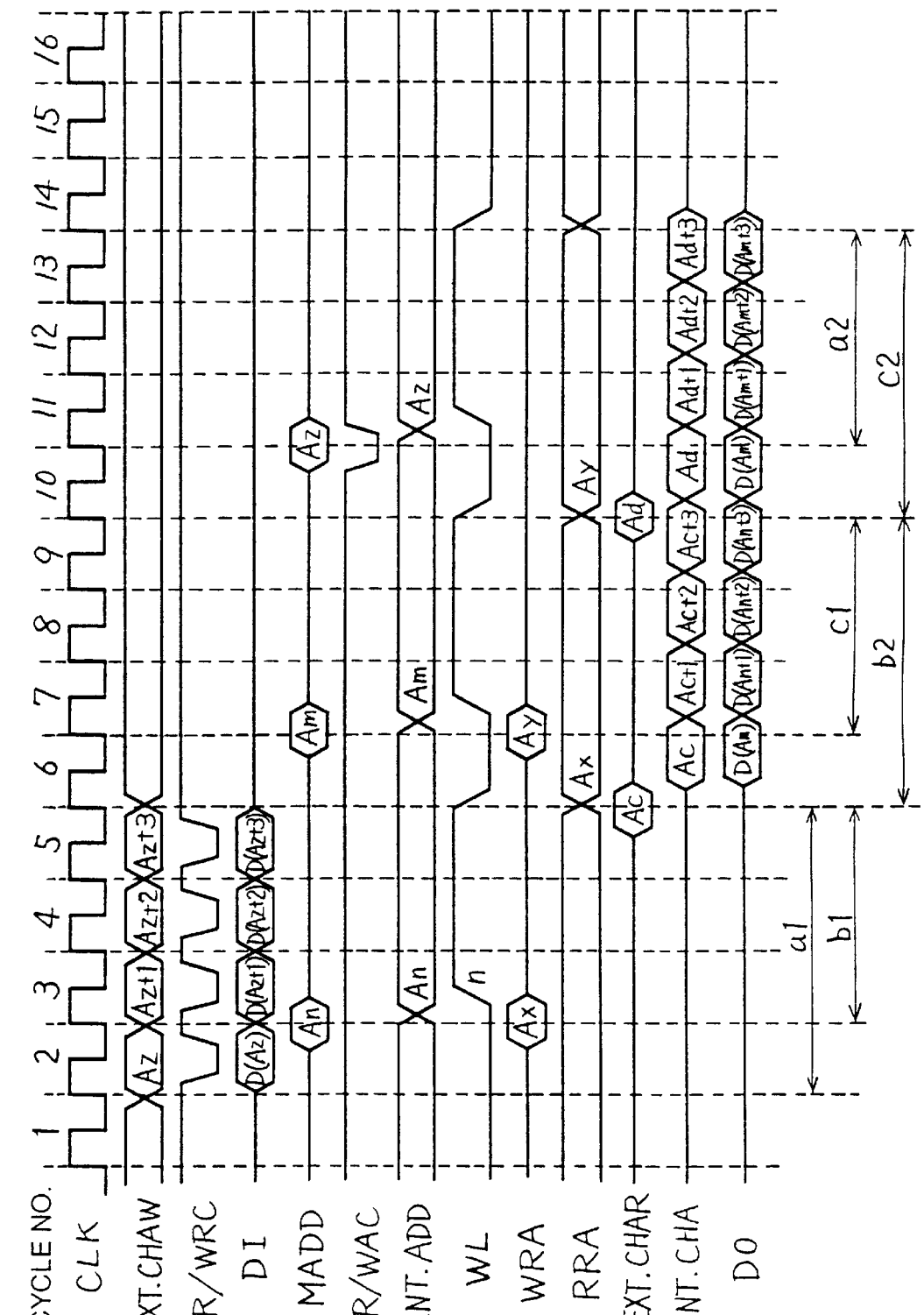
FIG. 10 is a timing chart showing typical waveforms of signals used by the fifth embodiment of FIG. 9 in data write and read operations.

How the fifth embodiment (i.e., SRAM) of FIG. 9 works in writing or reading data thereto or therefrom will now be described. FIG. 10 is a timing chart showing typical waveforms of signals used by the fifth embodiment in data write and read operations. In the description that follows, the signal-related workings that were already discussed in conjunction with the previously described embodiments are omitted hereunder where redundant.

The timing chart of FIG. 10 shows three different kinds of operation: writing of data to an address Az in the memory cell array 1; reading of data from the address An in the memory cell array 1; and reading of data from the address Am in the memory cell array 1.

The three kinds of operation are each divided into the steps detailed below. The operation of writing data to the address Az is divided into two steps, a1 and a2. Step a1 involves writing data to the input register 5L in the second through the fifth cycle. Step a2 involves transferring the data from the input register 5L to the memory cell array 1 in the 11th through the 13th cycle.

The operation of reading data from the address An is also divided into two steps, b1 and b2. Step b1 involves transferring data from the memory cell array 1 to the output register 5A or 5B in the third through the fifth cycle. Step b2 involves transferring the data from the output register 5A or 5B to the data input/output pin 9 in the sixth through the ninth cycle.

The operation of reading data from the address Am is also divided into two steps, c1 and c2. Step c1 involves transferring data from the memory cell array 1 to the output register 5A or 5B in the seventh through the ninth cycle. Step c2 involves transferring the data from the output register 5A or 5B to the data input/output pin 9 in the 10th through the 13th cycle.

Of the kinds of operations shown in FIG. 10, the data write and read operations are the same as those discussed in connection with the previously described embodiments and will not be discussed further, except for the following details:

The fifth embodiment (i.e., SRAM) of FIG. 9 requires that the sense amplifier 41 and the write driver 42 be operated alternately in writing and reading data to and from the memory cell array 1. When the array read/write control signal R/WAC is driven High, the sense amplifier 41 is activated selectively; when the array read/write control signal R/WAC is brought Low, the write driver 42 is operated selectively. The SRAM of FIG. 9 thus constituted permits writing and reading of data both in burst mode.

Furthermore, the fifth embodiment of FIG. 9 is characterized by another feature. This is the ability to carry out in an overlapping manner two kinds of data transfer: the transfer of data from the memory cell array 1 to the output register 5A or 5B (b1, c1), or the transfer of data from the input register 5L to the memory cell array 1 (a2) on the one hand; and the transfer of data from the output register 5A or 5B to the data input/output pin 9 (b2, c2), or the transfer of data from the data input/output pin 9 to the input register 5L (a1) on the other hand.

The overlapping actions implemented by the fifth embodiment of FIG. 9 boost the availability of the memory cell array 1. This in turn enhances the overall performance of the SRAM-based system.

Sixth Embodiment

The sixth embodiment of the invention will now be described. This embodiment involves rapidly reading out data which is held in the input register and not to be written to the memory cell array yet.

Figure 11:
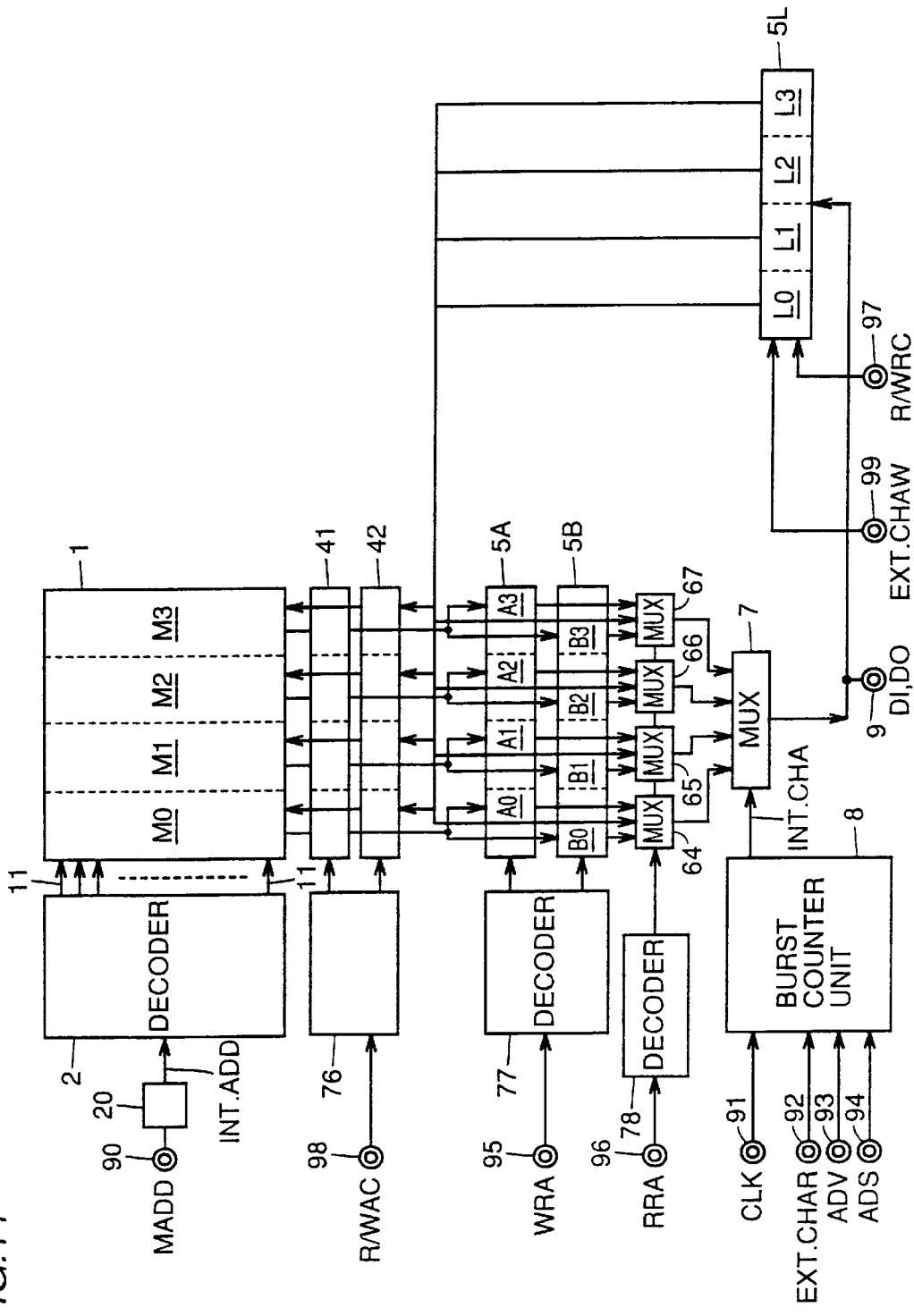
FIG. 11 is a block diagram of an SRAM practiced as a sixth embodiment of the invention and capable of operating in burst mode.
Figure 12:
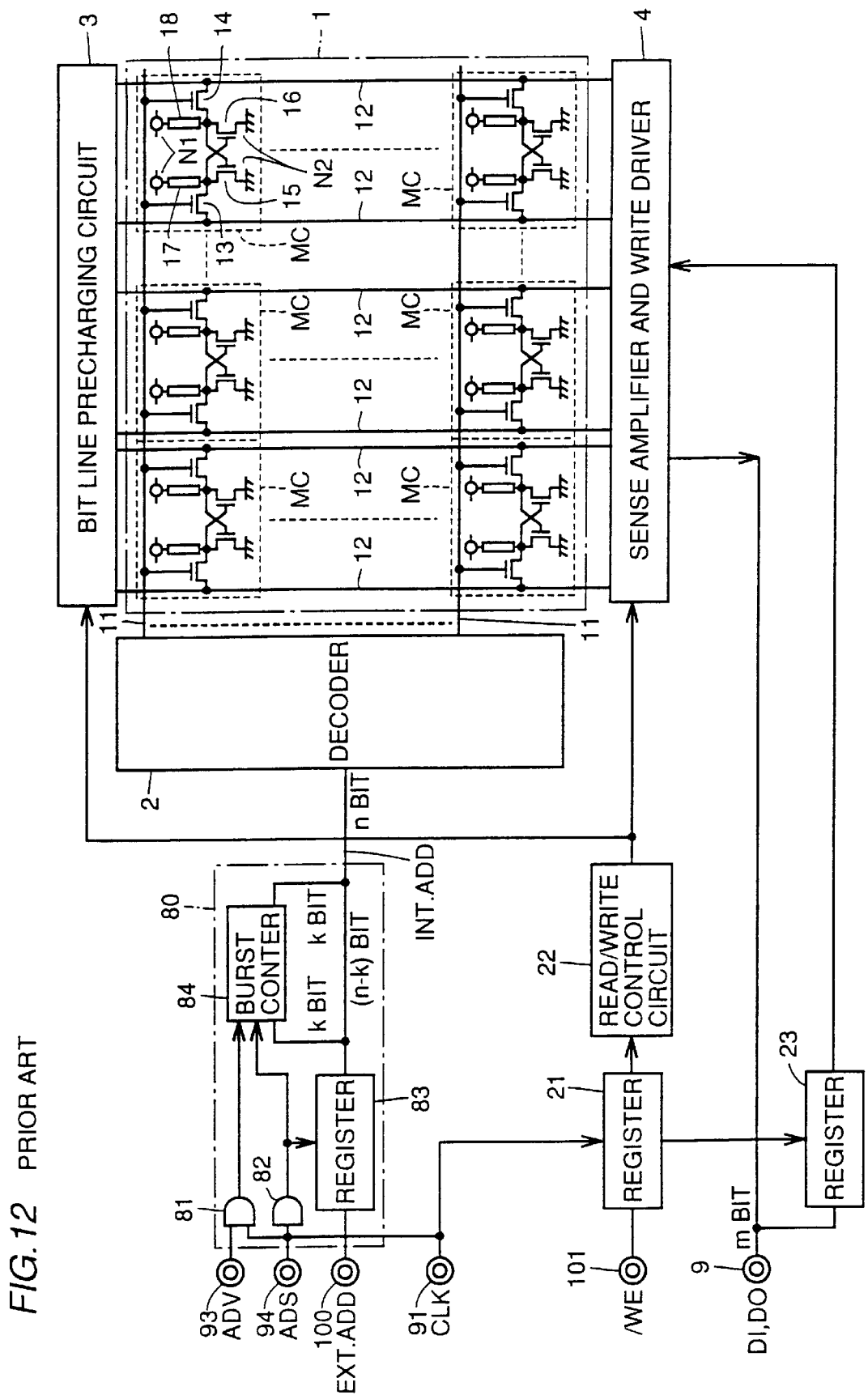
FIG. 12 is a block diagram of the conventional SRAM capable of operating in burst mode.
Figure 13:
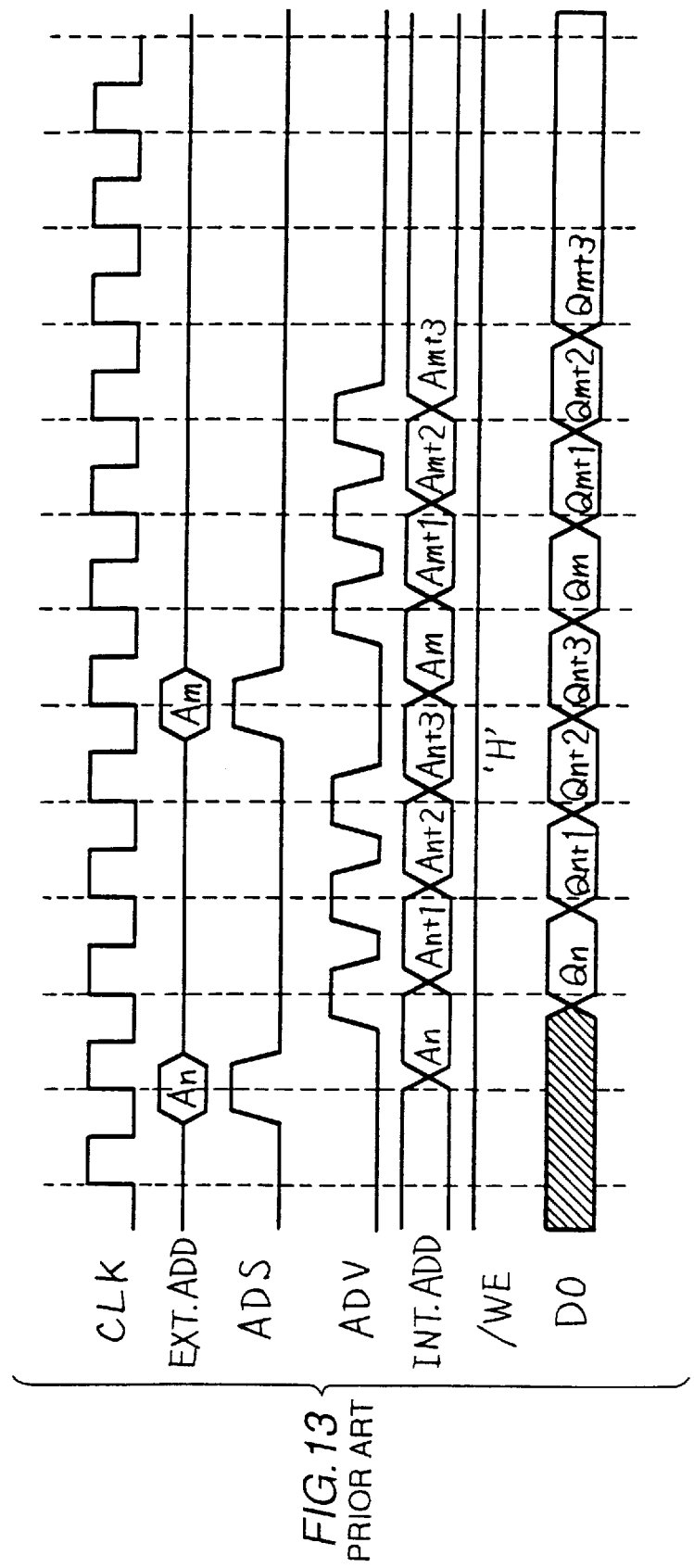
FIG. 13 is a timing chart showing typical waveforms of signals used by the conventional SRAM of FIG. 12 in a data read operation.
Figure 14:
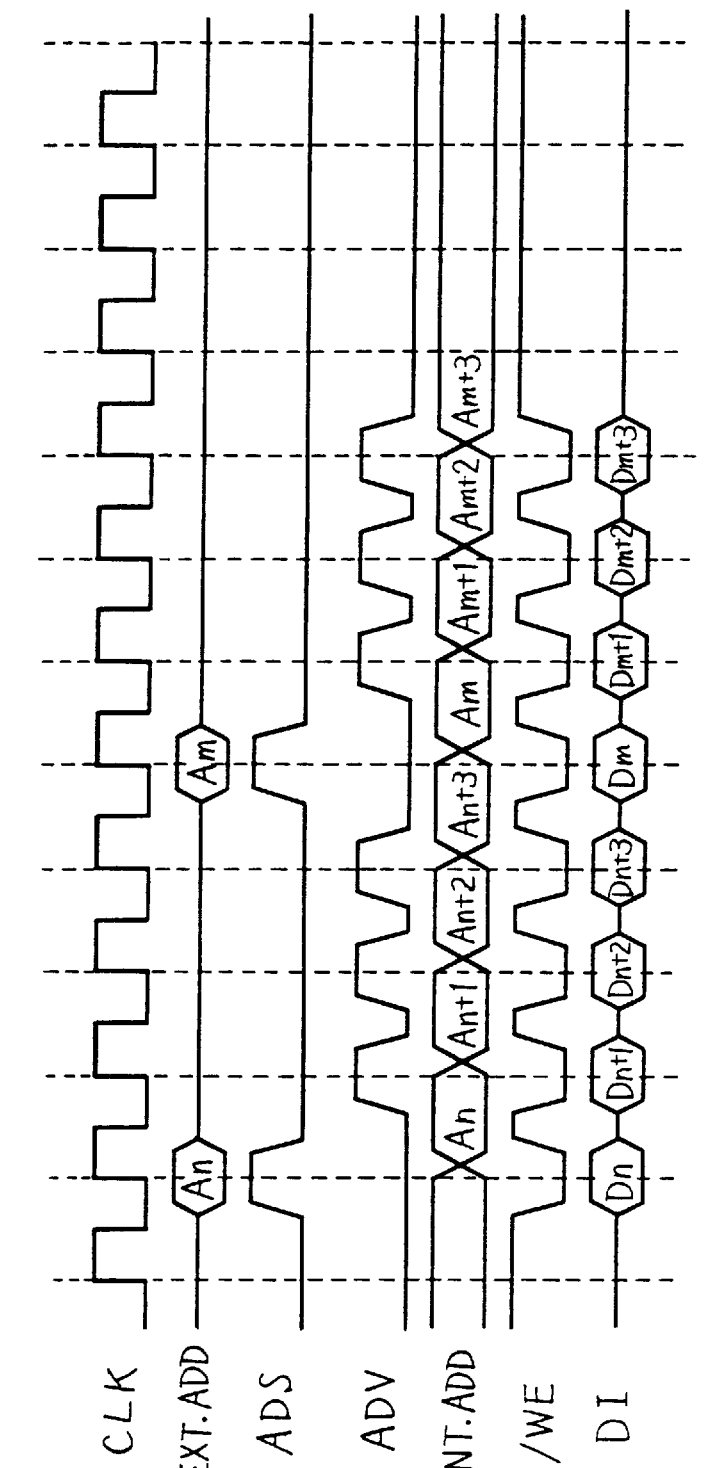
FIG. 14 is a timing chart showing typical waveforms of signals used by the conventional SRAM of FIG. 12 in a data write operation.

FIG. 11 is a block diagram of an SRAM practiced as the sixth embodiment of the invention and capable of operating in burst mode. In FIG. 11, the common parts that also appear in FIG. 9 are designated by like reference numerals, and their descriptions are omitted hereunder where redundant.

The sixth embodiment (i.e., SRAM) of FIG. 11 differs from the fifth embodiment of FIG. 9 mainly in the following points: the decoder 73 is replaced by a decoder 77, the multiplexers 60 through 63 are replaced by multiplexers 64 through 67, and the decoder 74 is replaced by a decoder 78. In addition, the data retained in the input register 5L is destined to the write driver 42 and to the multiplexers 64 through 67.

In response to the read register address signal RRA, the decoder 78 outputs a selection signal that causes each of the multiplexers 64 through 67 to select one of the three input data items. The multiplexers 64 through 67 correspond respectively to the multiplexers 60 through 63 in FIG. 9.

The data held in the data retaining blocks L0 through L3 of the input register 5L is supplied to the write driver 42. The retained data is also fed from the input register 5L to the multiplexers 64 through 67.

The multiplexer 64 receives the retained data from the data retaining blocks A0, B0 and L0. The multiplexer 65 receives the retained data from the data retaining blocks A1, B1 and L1. Likewise, the multiplexer 66 receives the retained data from the data retaining blocks A2, B2 and L2. Furthermore, the multiplexer 67 receives the retained data from the data retaining blocks A3, B3 and L3.

Given the selection signal from the decoder 78, each of the multiplexers 64 through 67 selects the appropriate data from one of the output registers 5A, 5B and the input register 5L. The appropriate data thus chosen is supplied selectively to the multiplexer 7.

As described, the sixth embodiment (SRAM) in FIG. 11 of the above constitution allows data which is held in the input register and not yet to be written to memory cells in the memory cell array 1 to be output to the outside via the data input/output pin 9. This feature helps output the entered data rapidly to the outside.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising:
    a memory cell array having a plurality of memory cells arranged in a plurality of rows and a plurality of columns for storing data, said memory cells being divided into a plurality of blocks each including a plurality of columns;
    a plurality of output registers for retaining data read from said blocks of said memory cell array, each of said output registers including a plurality of output data retaining blocks corresponding to said blocks of said memory cell array, each of said output data retaining blocks retaining data read from the corresponding block of said memory cell array;
    output register selecting means for selecting one of said output registers;
    counter means for performing a count in synchronization with a clock signal externally supplied;
    a data output pin for outputting the read data to the outside; and
    output data transfer means for successively selecting, in accordance with the result of the counting by said counter means, said output data retaining blocks of the output register selected by said output register selecting means, said output data transfer means further transferring data from the successively selected output data retaining blocks to said data output pin, thereby outputting said data over a plurality of cycles of said clock signal.

2. The semiconductor memory according to claim 1, wherein said output register selecting means receives an externally furnished address input signal designating the output register to be selected, and selects said output register in accordance with the address input signal.

3. A semiconductor memory comprising:
    a memory cell array having a plurality of memory cells arranged in a plurality of rows and a plurality of columns for storing data, said memory cells being divided into a plurality of blocks each including a plurality of columns;
    a plurality of output registers for retaining data written thereto after being read from said blocks of said memory cell array, each of said output registers including a plurality of output data retaining blocks corresponding to said blocks of said memory cell array, each of said output data retaining blocks retaining data read from the corresponding block of said memory cell array;
    write register selecting means for selecting one of said output registers to which data read from said memory cell array is to be written;
    read register selecting means for selecting one of said output registers from which the retained data is to be read;
    counter means for performing a count in synchronization with a clock signal externally supplied;
    a data output pin for outputting data to the outside; and
    output data transfer means for successively selecting, in accordance with the result of the counting by said counter means, said output data retaining blocks of the output register selected by said read register selecting means, said output data transfer means further transferring data from the successively selected output data retaining blocks to said data output pin, thereby outputting said data over a plurality of cycles of said clock signal.

4. The semiconductor memory according to claim 3, wherein said write register selecting means receives an externally supplied first address input signal designating the output register to be selected, and selects said output register in accordance with the first address input signal; and
    wherein said read register selecting means receives an externally furnished second address input signal designating the output register to be selected, and selects said output register in accordance with the second address input signal.

5. The semiconductor memory according to claim 3, wherein there are provided at least three units of said output registers, one of which fixedly retains some memory cell data from said memory cell array.

6. A semiconductor memory comprising:
    a memory cell array having a plurality of memory cells arranged in a plurality of rows and a plurality of columns for storing data said memory cells being divided into a plurality of blocks each including a plurality of columns;
    row selecting means for receiving a memory address input signal and for selecting a row of memory cells to be accessed in said memory cell array in accordance with said memory address input signal;

a data input pin for receiving externally input data over a plurality of operation cycles;

an input register for retaining data inputted via said data input pin to be written to memory cells in said memory cell array, said input register including a plurality of input data retaining blocks corresponding to said blocks of said memory cell array, each of said input data retaining blocks retaining the data to be written to the corresponding block of said memory cell array;

input data transfer means for receiving a control signal and for transferring, in accordance with said control signal, the retained data from each of said input data retaining blocks of said input register to memory cells in said memory cell array which are selected by said row selecting means;

wherein said input register receives an externally furnished chunk address input signal designating the input data retaining block for retaining data which is inputted in each of said operation cycles, and causes the input data retaining block designated by the chunk address input signal to retain the input data.

7. A semiconductor memory comprising:

a memory cell array having a plurality of memory cells arranged in a plurality of rows and a plurality of columns for storing data, said memory cells being divided into a plurality of blocks each including a plurality of columns;

row selecting means for receiving a memory address input signal and for selecting a row of memory cells to be accessed in said memory cell array in accordance with said memory address input signal;

a data input pin for receiving externally input data over a plurality of operation cycles;

an input register for retaining data inputted via said data input pin to be written to memory cells in said memory cell array, said input register including a plurality of input data retaining blocks corresponding to said blocks of said memory cell array, each of said input data retaining blocks retaining the data to be written to the corresponding block of said memory cell array;

input data transfer means for receiving a control signal and for transferring, in accordance with said control signal, the retained data from each of said input data retaining blocks of said input register to memory cells in said memory cell array which are selected by said row selecting means;

a plurality of output registers for retaining data read from said blocks of said memory cell array, each of said output registers including a plurality of output data retaining blocks corresponding to said blocks of said memory cell array, each of said output data retaining blocks retaining data read from the corresponding block of said memory cell array;

data selecting means for receiving the retained data from said output data retaining blocks of each of said output registers as well as the retained data from said input data retaining blocks of said input register, and for selecting data either from one of said output registers or from said input register in accordance with an externally supplied read address input signal;

counter means for receiving an externally furnished clock signal and for performing a count in synchronization with the clock signal;

a data output pin for outputting data to the outside; and output data transfer means in response to the result of the counting by said counter means for successively transferring data selected by said data selecting means to said data output pin, thereby outputting said data over a plurality of cycles of said clock signal.

8. A semiconductor memory comprising:

a memory cell array having a plurality of memory cells arranged in a plurality of rows and a plurality of columns for storing data, said memory cells being divided into a plurality of blocks each including a plurality of columns;

a data input pin for receiving externally input data over a plurality of operation cycles;

an input register for retaining data inputted via said data input pin to be written to memory cells in said memory cell array, said input register including a plurality of input data retaining blocks corresponding to said blocks of said memory cell array, each of said input data retaining blocks retaining data to be written to the corresponding block of said memory cell array;

a plurality of output registers for retaining data read from said blocks of said memory cell array, each of said output registers including a plurality of output data retaining blocks corresponding to said blocks of said memory cell array, each of said output data retaining blocks retaining data read from the corresponding block of said memory cell array;

a data output pin for outputting data to the outside;

first transfer means for transferring to said input register data inputted via said data input pin;

second transfer means for transferring the retained data from said input register to a plurality of blocks of said memory cell array;

third transfer means for transferring to said output registers data read from a plurality of blocks of said memory cell array; and fourth transfer means for transferring the retained data from said output registers to said data output pin.

9. The semiconductor memory according to claim 8, wherein two data transfer operations take place simultaneously, one of said two data transfer operations being performed either by said second transfer means or by said third transfer means, the other data transfer operation being carried out either by said first transfer means or by said fourth transfer means.

10. A semiconductor memory capable of operating burst output, comprising:

a memory cell array including a plurality of memory cells each for storing data;

a plurality of output registers each for retaining a plurality of data from said memory cell array, one of said plurality of output registers in response to a control signal for receiving the plurality of data;

output data transfer means in response to a select signal for selecting data transmitted from one of said plurality of output registers and serially outputting a predetermined number of the selected data to an output pin; and control means for applying said control signal and said select signal, and controlling said plurality of output registers and said output data transfer means so that (a) one of the plurality of output registers receives and retains a plurality of data corresponding to an address, (b) said output data transfer means selects the plurality of data corresponding to the address transmitted from one of the plurality of output registers, (c) another of the plurality of output registers receives a plurality of data corresponding to another address when said output data transfer means serially outputs a predetermined number of said plurality of data corresponding to the address, and retains the plurality of data corresponding to the other address, and (d) said output data transfer means selects the plurality of data corresponding to the other address transmitted from said another of the plurality of output registers in response to a request to read data corresponding to the address and the other address successively.

11. The semiconductor memory according to claim 10, wherein said control means includes a control circuit for outputting said control signal and said select signal, a decoder in response to said control signal for selecting one of the plurality of output registers which receives and retains data from said memory cell array, and a burst counter unit for receiving an externally applied clock signal and outputting an internal chunk address signal, and said output data transfer means includes first multiplexers in response to said select signal for selecting data transmitted from one of said plurality of output registers, and a second multiplexer in response to said internal chunk address signal for serially outputting a predetermined number of the data selected by said first multiplexers to the output pin.

12. The semiconductor memory according to claim 10, wherein said control means includes a pin receiving said control signal externally applied, a first decoder in response to said control signal for selecting one of the plurality of output registers which receives and retains data from said memory cell array, a second decoder for outputting said select signal, and a burst counter unit for receiving an externally applied clock signal and outputting an internal chunk address signal, and said output data transfer means includes first multiplexers in response to said select signal for selecting data transmitted from one of said plurality of output registers, and a second multiplexer in response to said internal chunk address signal for serially outputting a predetermined number of the data selected by said first multiplexers to the output pin.

* * * * *